(12) United States Patent
Kiyosawa et al.

(10) Patent No.: US 10,600,880 B2
(45) Date of Patent: Mar. 24, 2020

(54) SEMICONDUCTOR DEVICE AND METHOD FOR MANUFACTURING THE SAME

(71) Applicant: Panasonic Intellectual Property Management Co., Ltd., Osaka (JP)

(72) Inventors: Tsutomu Kiyosawa, Toyama (JP); Yasuyuki Yanase, Osaka (JP); Kazuhiro Kagawa, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/027,978

(22) Filed: Jul. 5, 2018

(65) Prior Publication Data

US 2018/0315823 A1 Nov. 1, 2018

Related U.S. Application Data

(63) Continuation of application No. 15/434,022, filed on Feb. 15, 2017, now Pat. No. 10,043,877, which is a
(Continued)

(30) Foreign Application Priority Data

Sep. 8, 2014 (JP) .................................. 2014-182330

(51) Int. Cl.
*H01L 29/423* (2006.01)
*H01L 29/78* (2006.01)
(Continued)

(52) U.S. Cl.
CPC ...... *H01L 29/4236* (2013.01); *H01L 21/0243* (2013.01); *H01L 21/0262* (2013.01);
(Continued)

(58) Field of Classification Search
CPC ............. H01L 29/4236; H01L 29/1608; H01L 29/045; H01L 29/1095; H01L 29/7813;
(Continued)

(56) References Cited

U.S. PATENT DOCUMENTS

2005/0224838 A1* 10/2005 Tanaka ................. H01L 29/165
257/187
2005/0233539 A1 10/2005 Takeuchi et al.
(Continued)

FOREIGN PATENT DOCUMENTS

JP      9-172187 A      6/1997
JP      2005-328014 A   11/2005
(Continued)

OTHER PUBLICATIONS

Office Action issued in U.S. Appl. No. 15/434,022, dated Nov. 20, 2017.
(Continued)

*Primary Examiner* — Thanh T Nguyen
(74) *Attorney, Agent, or Firm* — McDermott Will & Emery LLP

(57) ABSTRACT

A semiconductor device includes a substrate having a main surface inclined in an off-direction from a {0001} surface, and a semiconductor layer. The semiconductor layer includes a level difference for alignment mark. An epitaxial layer is disposed on a first portion of the main surface, the first portion being situated on an off-angle upstream side of the level difference, and on a second portion of the main surface, the second portion being situated on an off-angle downstream side of the level difference. A value of |WL−WR| is 1 μm or less, in which WL represents a distance from a center of the level difference to a boundary between an off-angle upstream side corner portion of the level difference and a main surface or a {0001} facet plane generated on the
(Continued)

main surface, and WR represents a distance from the center of the level difference to a boundary between an off-angle downstream side corner portion of the level difference and the main surface or the {0001} facet plane generated on the main surface.

6 Claims, 19 Drawing Sheets

Related U.S. Application Data continuation of application No. PCT/JP2015/004349, filed on Aug. 28, 2015.

(51) Int. Cl.

| | | |
|---|---|---|
| H01L 23/544 | (2006.01) | |
| H01L 21/02 | (2006.01) | |
| H01L 21/324 | (2006.01) | |
| H01L 21/04 | (2006.01) | |
| H01L 29/04 | (2006.01) | |
| H01L 29/10 | (2006.01) | |
| H01L 29/16 | (2006.01) | |
| H01L 29/66 | (2006.01) | |
| H01L 21/205 | (2006.01) | |

(52) U.S. Cl.
CPC .. *H01L 21/02378* (2013.01); *H01L 21/02433* (2013.01); *H01L 21/02447* (2013.01); *H01L 21/02529* (2013.01); *H01L 21/02579* (2013.01); *H01L 21/049* (2013.01); *H01L 21/205* (2013.01); *H01L 21/3247* (2013.01); *H01L 23/544* (2013.01); *H01L 29/045* (2013.01); *H01L 29/1095* (2013.01); *H01L 29/1608* (2013.01); *H01L 29/66068* (2013.01); *H01L 29/7813* (2013.01); *H01L 29/7828* (2013.01); *H01L 21/0485* (2013.01); *H01L 2223/5446* (2013.01); *H01L 2223/54426* (2013.01)

(58) Field of Classification Search
CPC ............. H01L 21/049; H01L 29/66068; H01L 21/3247; H01L 21/302; H01L 21/3065; H01L 21/02378; H01L 29/66037; H01L 29/7397; H01L 21/0475; H01L 21/28026; H01L 21/31116; H01L 21/324; H01L 29/66734; H01L 29/66045; H01L 29/7828; H01L 21/68735; H01L 29/0696; H01L 29/2003; H01J 37/32091
See application file for complete search history.

(56) References Cited

U.S. PATENT DOCUMENTS

| | | | |
|---|---|---|---|
| 2006/0097268 A1 | 5/2006 | Kumar et al. | |
| 2012/0319249 A1* | 12/2012 | Uchida | ................ H01L 29/045 |
| | | | 257/628 |
| 2013/0140586 A1 | 6/2013 | Takahashi et al. | |
| 2013/0168701 A1 | 7/2013 | Kiyosawa et al. | |
| 2013/0237042 A1* | 9/2013 | Nishio | .............. H01L 21/02658 |
| | | | 438/499 |
| 2014/0183562 A1 | 7/2014 | Kiyosawa et al. | |

FOREIGN PATENT DOCUMENTS

| | | | |
|---|---|---|---|
| JP | 2006-156962 | A | 6/2006 |
| JP | 2007-280978 | A | 10/2007 |
| JP | 2011-100928 | A | 5/2011 |
| JP | 5526291 | B1 | 6/2014 |
| WO | 2013/001782 | A1 | 6/2012 |
| WO | 2013/042333 | A1 | 3/2013 |

OTHER PUBLICATIONS

Notice of Allowance issued in U.S. Appl. No. 15/434,022, dated Apr. 11, 2018.
International Search Report of PCT Application No. PCT/JP2015/004349, dated Nov. 2, 2015.
Yi Chen et al., "Homoepitaxy of 4 H-SiC on Trenched (0001) Si Face Substrates by Chemical Vapor Deposition", Japanese Journal of Applied Physics vol. 43, No. 7A, 2004, pp. 4105-4109.

* cited by examiner (0001) Just surface    Off-angle θ

SEMICONDUCTOR DEVICE AND METHOD FOR MANUFACTURING THE SAME

RELATED APPLICATIONS

This application is a continuation of U.S. patent application Ser. No. 15/434,022, filed on Feb. 15, 2017, which is a continuation of PCT/JP2015/004349, filed Aug. 28, 2015, which claims foreign priority of Japanese Patent Application No. 2014-182330, filed on Sep. 8, 2014, the entire contents of each of which are incorporated herein by reference.

BACKGROUND

1. Technical Field

The present disclosure relates to a semiconductor device and a method for manufacturing the semiconductor device, and particularly to a semiconductor device for high voltages and large currents, and a method for manufacturing the semiconductor device.

2. Description of the Related Art

Silicon carbide (SiC) is a semiconductor material having a larger band gap and higher dielectric breakdown electric field strength as compared to silicon (Si), and is expected to be applied to next-generation low-loss power devices etc. SiC includes many polytypes such as cubic 3C-SiC, and hexagonal 6H-SiC and 4H-SiC.

As a typical switching element for power devices using SiC, mention is made of a field effect transistor such as a metal insulator semiconductor field effect transistor (hereinafter, abbreviated as a "MISFET") or a metal semiconductor field effect transistor (hereinafter, abbreviated as a "MESFET"). The switching element is capable of switching between an on-state in which a drain current of several amperes (A) or more passes and an off-state in which a drain current does not pass, according to a voltage applied between a gate electrode and a source electrode. In an off-state, a high voltage of several hundred volts (V) can be achieved.

Enhancement of a device integration degree is effective for feeding a further large current in a power device such as a MISFET. Thus, a vertical power MISFET having a trench gate structure (hereinafter, abbreviated as a "trench-type MISFET") as a structure that will replace a conventional planar gate structure has been proposed (e.g., Patent Literature 1). In the trench-type MISFET, a channel region is formed on a side wall portion of a trench formed in a semiconductor layer, and therefore a unit cell area can be reduced. As a result, a device integration degree can be improved.

A trench-type MISFET having a structure in which as a channel layer, a thin epitaxial layer is formed on a side wall portion of a trench has also been proposed.

On the other hand, Non-Patent Literature 1 describes that when a trench is formed in a 4H-SiC(0001) substrate with an off-angle of 8°, and silicon carbide is epitaxially grown in the trench, a (0001) facet plane may be generated on a main surface of the SiC substrate due to step flow growth of the silicon carbide.

CITATION LIST

Patent Literature

Patent Literature 1: Unexamined Japanese Patent Publication No. 9-172187

Non-Patent Literature

Non-Patent Literature 1: Japanese Journal of Applied Physics Vol. 43, No. 7A, 2004, pp. 4105-4109, Homoepitaxy of 4H-SiC on Trenched (0001) Si Face Substrates by Chemical Vapor Deposition, Yi CHEN

SUMMARY

The inventors of the present disclosure have conducted studies, and resultantly found that in a trench-type MISFET including a channel layer, a {0001} facet plane is formed near a peripheral edge of a trench, and as a result, it may be unable to obtain desired device characteristics. Details will be described later.

The present disclosure provides a semiconductor device in which deterioration of device characteristics that is caused by a {0001} facet plane generated near a peripheral edge of a trench can be suppressed.

One aspect of the present disclosure provides a semiconductor device including: a substrate having a main surface inclined in an off-direction from a {0001} surface; and a semiconductor layer disposed on the main surface of the substrate. The semiconductor layer includes: a first conductive-type drift region; a second conductive-type body region disposed on the first conductive-type drift region; a first conductive-type source region which is disposed on the second conductive-type body region and which is in contact with an upper surface of the semiconductor layer; and a trench extending through the second conductive-type body region and the first conductive-type source region and having a bottom portion in the first conductive-type drift region. Where an upstream side is an off-angle upstream side and a downstream side is an off-angle downstream side in a direction with the off-direction projected on the main surface of the substrate, a side wall of the trench includes a first side wall portion and a second side wall portion facing each other and each crossing the off-direction of the substrate, and the first side wall portion is situated closer to the off-angle upstream side than the second side wall portion. The semiconductor device further includes: an epitaxial layer disposed at least on the first side wall portion and the second side wall portion of the trench, and a part of a main surface of the first conductive-type source region in a region adjacent to the trench; and a source electrode disposed on the first conductive-type source region so as to be in contact with the first conductive-type source region. The epitaxial layer is disposed on a first portion of the main surface of the first conductive-type source region, the first portion being situated on the off-angle upstream side of the trench, and on a second portion of the main surface of the first conductive-type source region, the second portion being situated on the off-angle downstream side of the trench. A relationship of TS>|TL−TR| is satisfied, in which TL represents a maximum thickness of the epitaxial layer on the first portion, TR represents a minimum thickness of the epitaxial layer on the second portion (TR>0), and TS represents a thickness of the first conductive-type source region.

According to one exemplary embodiment of the present disclosure, there are provided a trench-type semiconductor device including a substrate having an off-angle, in which generation of a {0001} facet plane near a peripheral edge of a trench is suppressed; and a method for manufacturing the semiconductor device. Therefore, deterioration of device characteristics which is caused by the {0001} facet plane can be suppressed.

BRIEF DESCRIPTION OF THE DRAWINGS

FIG. 1A schematically shows a semiconductor device according to a first exemplary embodiment;

FIG. 7A schematically shows a semiconductor device according to a modification of the first exemplary embodiment;

FIG. 8A shows a shape of the trench before formation of an epitaxial film;

FIG. 8B shows a shape of the trench after formation of epitaxial film 12A (comparative example);

FIG. 8C shows a shape of the trench after formation of epitaxial film 12B (example);

FIG. 9A schematically shows one example of a relationship between an off-direction of an off-angle set on a substrate for forming a semiconductor device and a surface orientation of a channel surface of the trench;

FIG. 9B schematically shows one example of a relationship between an off-direction of an off-angle set on a substrate for forming a semiconductor device and a surface orientation of a channel surface of the trench;

FIG. 9C schematically shows one example of a relationship between an off-direction of an off-angle set on a substrate for forming a semiconductor device and a surface orientation of a channel surface of the trench;

FIG. 10A schematically shows another example of a relationship between an off-direction of an off-angle set on a substrate for forming a semiconductor device and a surface orientation of a channel surface of the trench;

FIG. 10B schematically shows another example of a relationship between an off-direction of an off-angle set on a substrate for forming a semiconductor device and a surface orientation of a channel surface of the trench;

FIG. 10C schematically shows another example of a relationship between an off-direction of an off-angle set on a substrate for forming a semiconductor device and a surface orientation of a channel surface of the trench;

FIG. 14A shows a metal microscope image of a wafer surface in growth under conventional epitaxial growth conditions in the trench formed on the wafer surface;

FIG. 14B shows a metal microscope image of a wafer surface in growth under epitaxial growth conditions in the present disclosure (a growth rate is 3.0 μm/hr or less, preferably 1.0 μm/hr or less) in the trench formed on the wafer surface;

FIG. 15A schematically shows a semiconductor device according to a second exemplary embodiment, and an alignment mark;

FIG. 15B schematically shows the semiconductor device according to the second exemplary embodiment, and an alignment mark;

Figure 1A:
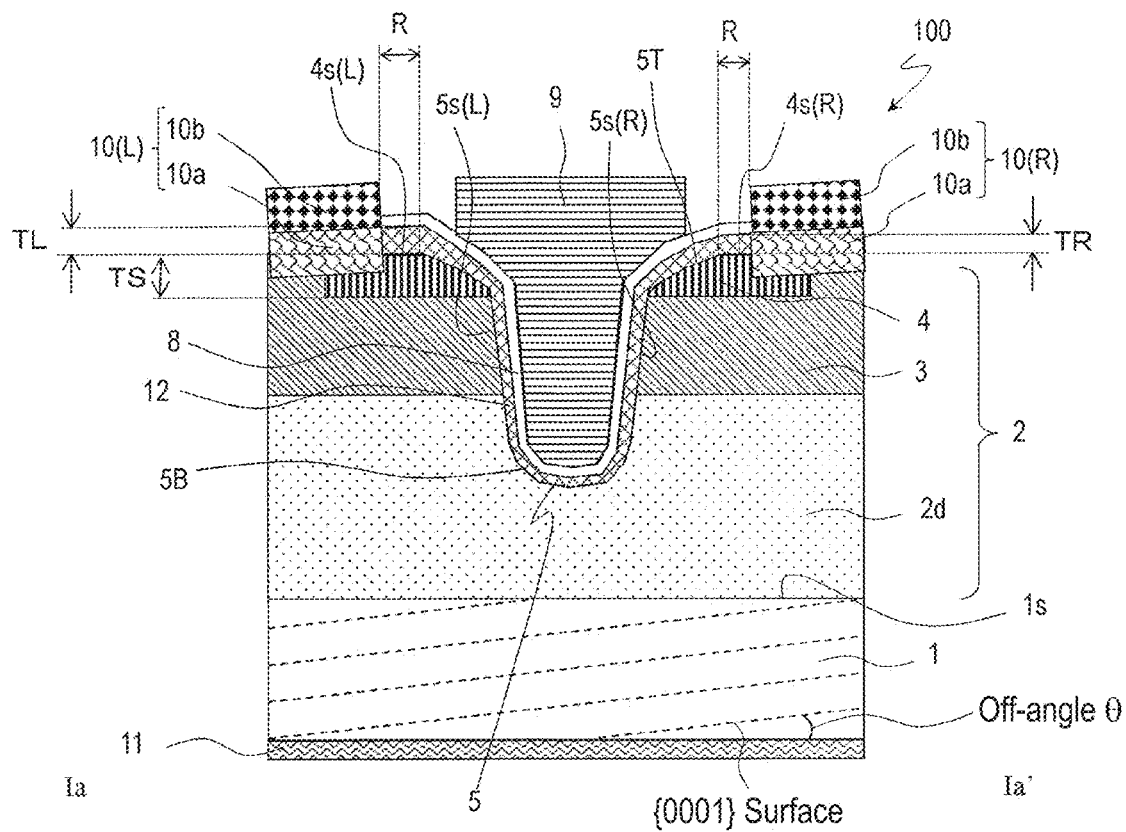
FIG. 1A is a sectional view taken along line Ia-Ia' shown in FIG. 1B.

DETAILED DESCRIPTION (Circumstances Leading to the Present Disclosure)

First, a general configuration of a trench-type MISFET will be described with a SiC-MISFET shown as an example.

A trench-type MISFET generally includes an n-type SiC substrate, and a silicon carbide (SiC) layer formed on a main surface of the SiC substrate by epitaxial growth. The SiC layer has an n-type drift region, a p-type body region, and an n-type source region disposed in the body region so as to be in contact with the body region. Typically, the body region is situated above the drift region, and the source region is situated near a surface of the body region. The SiC layer is provided with a trench extending through the source region and the body region. A gate insulating film and a gate electrode are provided in the trench. The gate insulating film covers a side wall and a bottom portion of the trench, and is disposed so as to insulate the gate electrode and the silicon carbide layer. At least a part of the gate electrode may be embedded in the trench. A source electrode is provided on the SiC layer so as to be in contact with the source region and the body region. A back surface of the SiC substrate is provided with a drain electrode.

A reactive ion etching (RIE), damage an ion implanting damage or the like is introduced into the side wall of the trench, so that it may be unable to obtain a favorable channel mobility. A thin epitaxial layer (channel layer) may be formed between the side wall of the trench and the gate insulating film in order to suppress a reduction in channel mobility due to damage to the trench side wall.

In the SiC-MISFET, a SiC substrate with an off-angle, whose main surface has an off-angle, is used as a SiC substrate. Accordingly, silicon carbide can be epitaxially grown on the main surface of the SiC substrate by means of a step flow in lateral growth, and therefore epitaxial growth of silicon carbide can be stabilized. The SiC substrate is, for example, a substrate with an off-angle, whose main surface has an off-angle of about 4° to 8° in a <11-20> direction (off-direction) with respect to a {0001} surface. Herein, a symbol "-" given to each of a Miller index in a surface orientation and an index in a crystal axis denotes a reversal of one index following the symbol for convenience' sake.

The trench may have a stripe shape extending in one direction (extending direction) when seen from above the SiC substrate. Two mutually facing side walls along the extending direction of the trench are each formed by, for example, a {11-20} surface excellent in channel mobility of carriers.

The channel layer may be formed not only on the side wall of the trench but also on a region of an upper surface of the SiC layer, which is situated near a peripheral edge of the trench.

The SiC layer and the channel layer are epitaxial growth layers formed by epitaxial growth. For formation of the epitaxial growth layer, for example, a chemical vapor deposition (CVD) apparatus is used. Epitaxial growth conditions are not particularly limited. For formation of the epitaxial layer, a silicon-based gas such as, for example, a silane ($SiH_4$) gas, and a carbon-based gas such as, for example, a propane ($C_3H_8$) gas are generally used. These gases are each supplied in an amount of, for example, about 20 sccm to 50 sccm to a surface of the SiC substrate which is provided with the trench. The SiC substrate is heated to a temperature of, for example, 1500° C. to 1600° C. inclusive.

In a conventional trench-type MISFET, a {0001} facet plane may be generated near a peripheral edge of a trench due to formation of an epitaxial layer. Hereinafter, a method for forming an epitaxial layer and a cause of formation of a {0001} facet plane will be described with reference to drawings.

Figure 12A:
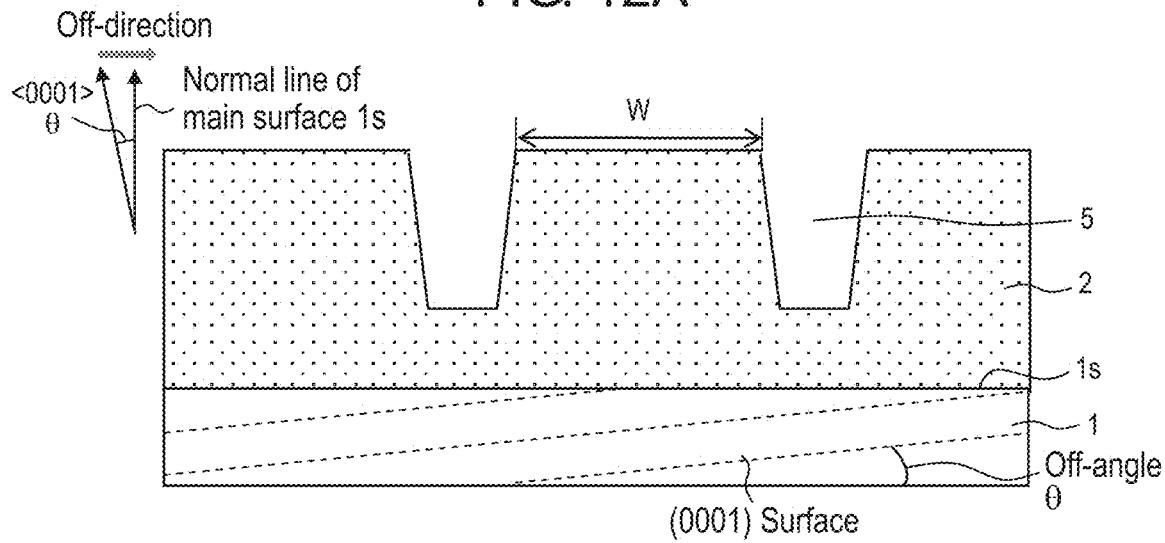
FIG. 12A is a schematic process sectional view for explaining a situation in which {0001} facet plane F is generated on a main surface of a SiC layer in a region adjacent to a trench.
Figure 12B:
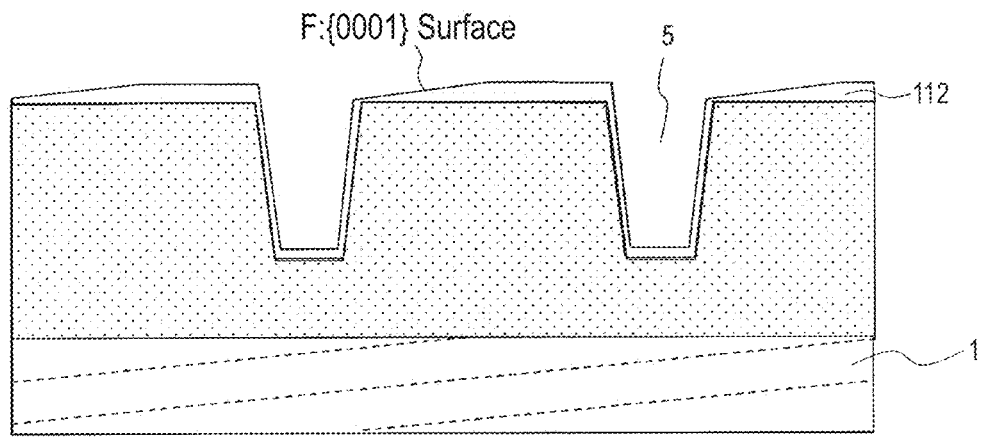
FIG. 12B is a schematic process sectional view for explaining a situation in which {0001} facet plane F is generated on a main surface of a SiC layer in a region adjacent to a trench.
Figure 12C:
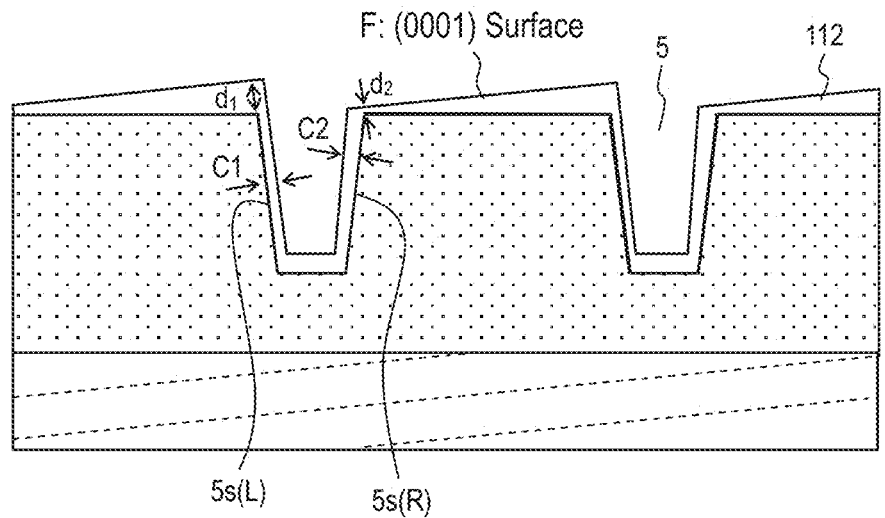
FIG. 12C is a schematic process sectional view for explaining a situation in which {0001} facet plane F is generated on a main surface of a SiC layer in a region adjacent to a trench.
Figure 13A:
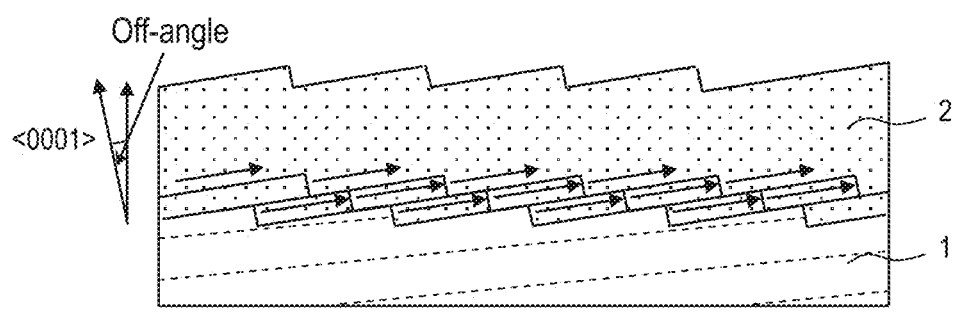
FIG. 13A is a schematic enlarged sectional view for explaining a mechanism in which {0001} facet plane F is generated on a main surface of a SiC layer in a region adjacent to a trench.
Figure 13B:
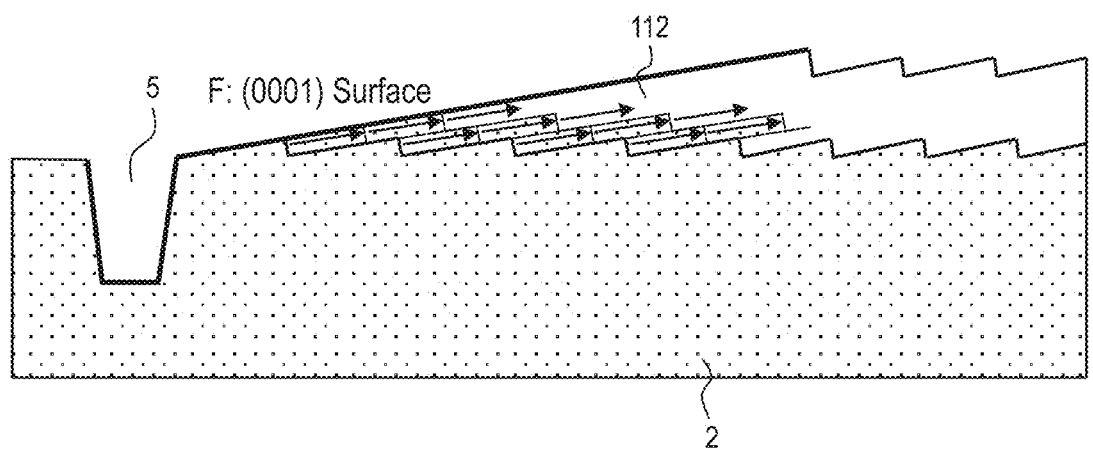
FIG. 13B is a schematic enlarged sectional view for explaining a mechanism in which {0001} facet plane F is generated on a main surface of a SiC layer in a region adjacent to a trench.

FIGS. 12A to 12C are process sectional views for explaining a process for forming a trench and an epitaxial layer (channel layer) on a SiC layer. FIGS. 13A and 13B are enlarged sectional views schematically showing a SiC layer and an epitaxial layer.

First, SiC layer 2 is formed on SiC substrate 1 with an off-angle by epitaxial growth. As SiC substrate 1, for example, a generally distributed 4°-off {0001} SiC substrate in which an off-direction is a <11-20> direction. From a microscopic point of view, the epitaxial growth layer is formed through a mode in which supply raw material molecules are adsorbed to an atom step of SiC substrate 1 to grow the layer (step flow growth) as schematically shown in FIG. 13A. Epitaxial growth proceeds from a left side (off-angle upstream side) to a right side (off-angle downstream side) in FIG. 13A. Steps are formed on an upper surface (main surface) of resulting SiC layer 2 due to step flow growth.

A plurality of trenches 5 are then formed on SiC layer 2 as shown in FIG. 12A. Here, each trench 5 is disposed so as to have a side wall including a {11-20} surface excellent in channel mobility.

Next, as shown in FIG. 12B, silicon carbide is epitaxially grown on SiC substrate 1 provided with trenches 5. At this time, trenches 5 stop continuous growth in a lateral direction from the off-angle upstream side to the off-angle downstream side. Resultantly, as schematically shown in FIG. 13B, formation of {0001} facet plane F is started at a portion of a peripheral edge of trench 5, which is situated on the off-angle downstream side of trench 5, on the upper surface of SiC layer 2.

By causing epitaxial growth of silicon carbide to further proceed, epitaxial layer (channel layer) 112 is obtained as shown in FIG. 12C. {0001} facet plane F formed on epitaxial layer 112 further extends. {0001} facet plane F may extend to other trench adjacent to the off-angle downstream side as shown in FIG. 12C.

As a result of formation of {0001} facet plane F, trench 5 may lose its shape and become left-right-asymmetric. The term "left-right-asymmetric" mentioned here means that at a cross-section parallel to the off-direction, a shape on the off-angle downstream side is different from a shape on the off-angle upstream side.

When trench 5 becomes left-right-asymmetric, a thickness of epitaxial layer 112 formed on the upper surface of SiC layer 2 considerably varies between the off-angle upstream side and the off-angle downstream side of trench 5 near the peripheral edge of trench 5. For example, where a width of the main surface between trenches, i.e. width w between an end portion of the trench on the off-angle downstream side and an end portion of the adjacent trench on the off-angle upstream side is 5 µm, and off-angle θ is 4°, a difference between thickness d1 of epitaxial layer 112 on the end portion of trench 5 on the off-angle upstream side and thickness d2 of epitaxial layer 112 on the end portion of trench 5 on the off-angle downstream side is, for example, about 0.35 µm (=5 (µm)×tan 4° at most.

The inventors of the present disclosure have conducted studies, and resultantly found that when a trench-type MISFET having epitaxial layer 112 as a channel layer is prepared, it may be difficult to ensure that the source electrode (including an alloy layer) and the source region situated below the epitaxial layer are evenly in contact with each other on the off-angle upstream side and the off-angle downstream side of trench 5 due to a difference in thickness of epitaxial layer 112 as described above. Thus, there may be such a problem that contact resistance varies between the off-angle upstream side and the off-angle downstream side of trench 5. As a result, it may be unable to sufficiently exhibit device characteristics.

A difference in thickness of epitaxial layer 112 between the end portion of trench 5 on the off-angle upstream side and the end portion of trench 5 on the off-angle downstream side means that a consumption of a raw material supplied during epitaxial growth varies between the off-angle upstream side and the off-angle downstream side of trench 5. Due to the difference in consumption, a concentration of the raw material arriving at each side wall of trench 5 may vary depending on a position of the side wall. Specifically, near the end portion of trench 5 on the off-angle upstream side, the consumption of the raw material is high, so that an amount of the raw material arriving at a portion 5s(L) of the side wall of trench 5 on the off-angle upstream side (hereinafter, referred to as a "first side wall portion") decreases. On the other hand, near the end portion of trench 5 on the off-angle downstream side, the consumption of the raw material is low, so that the amount of the raw material arriving at a portion 5s(R) on the off-angle downstream side (hereinafter, referred to as a "second side wall portion") increases. Thus, the thickness of epitaxial layer 112 is smaller on first side wall portion 5s(L) than on second side wall portion 5s(R). Portions of epitaxial layer 112, which are situated on first side wall portion 5s(L) and on second side wall portion 5s(R), are each provided with a channel. Thus, when the thickness of epitaxial layer 112 on first side wall portion 5s(L) is different from the thickness of epitaxial layer 112 on second side wall portion 5s(R), there is a possibility that a gate threshold voltage varies between the off-angle upstream side and the off-angle downstream side of trench 5.

It is thus apparent that in a conventional trench-type MISFET, generation of {0001} facet plane F increases variations in contact resistance and gate threshold voltage in an element, and therefore it is difficult to sufficiently exhibit performance of a semiconductor device. For exhibiting performance of a semiconductor device, which matches a channel mobility of epitaxial layer 112, it is desirable to suppress {0001} facet plane F generated on an upper surface of epitaxial layer 112.

While explanations have been given above with a silicon carbide MISFET as an example, a semiconductor device including a semiconductor other than silicon carbide (e.g., other wide band gap semiconductor such as GaN, AlN or diamond) may also have the above-mentioned problems associated with generation of {0001} facet plane F when a substrate having an off-angle is used.

Methods for reducing a facet are described in, for example, Non-Patent Literature 1 and Patent Literature 1. Non-Patent Literature 1 discloses reduction of a facet by decreasing a molar ratio (C/Si ratio) of a C-based gas and a Si-based gas which are supplied in epitaxial growth of silicon carbide. The inventors of the present disclosure have conducted studies, and resultantly found that even when the C/Si ratio is adjusted as shown in Non-Patent Literature 1, it may be unable to sufficiently reduce a facet, leading to persistent asymmetry in a trench. Thus, it is difficult to sufficiently exhibit device characteristics. Patent Literature 1 discloses use of a {1-100} surface for a trench side wall surface serving as a channel. Accordingly, asymmetry of a trench, which is caused by a facet, may be remedied. However, there is such a problem that the {1-100} surface is inferior in channel mobility to the {11-20} surface, and therefore on-resistance of the device increases as compared to a case where the {11-20} surface is used for the trench side wall surface.

The inventors of the present disclosure have extensively conducted studies in view of the above-mentioned problems. Resultantly, the inventors of the present disclosure have found that depending on epitaxial growth conditions in formation of an epitaxial layer serving as a channel layer, generation of a {0001} facet plane can be suppressed, leading to suppression of variations in characteristics. Thus, the inventors of the present disclosure have devised a semiconductor device as described below.

An outline of one aspect of the present disclosure is as follows.

A semiconductor device as one aspect of the present disclosure is a semiconductor device including: a substrate having a main surface inclined in an off-direction from a {0001} surface; and a semiconductor layer disposed on the main surface of the substrate. The semiconductor layer includes a first conductive-type drift region, a second conductive-type body region disposed on the drift region, a first conductive-type source region which is disposed on the body region and which is in contact with an upper surface of the semiconductor layer, and a trench extending through the body region and the source region and having a bottom portion in the drift region. Where in a direction with the off-direction projected on the main surface of the substrate, an upstream side is an off-angle upstream side and a downstream side is an off-angle downstream side, a side wall of the trench includes first and second side wall portions facing each other, and each crossing the off-direction of the substrate. The first side wall portion is situated closer to the off-angle upstream side than the second side wall portion. The semiconductor device further includes an epitaxial layer disposed at least on the first and second side wall portions of the trench and on a part of a main surface of the source region in a region adjacent to the trench, and a source electrode disposed on the source region so as to be in contact with the source region. The epitaxial layer is disposed on a first portion of the main surface of the source region which is situated on the off-angle upstream side of the trench and on a second portion of the main surface of the source region which is situated on the off-angle downstream side of the trench. The semiconductor device satisfies a relationship of TS>|TL−TR| where TL is a maximum thickness of the epitaxial layer on the first portion, TR is a minimum thickness of the epitaxial layer on the second portion (TR>0), and TS is a thickness of the source region.

Further preferably, the semiconductor device satisfies a relationship of TS/2>|TL−TR|.

The trench may further include a first upper corner portion situated between the first side wall portion and the first portion of the source region, and a second upper corner portion situated between the second side wall portion and the second portion of the source region. The epitaxial layer may include, on the first upper corner portion and the second upper corner portion, a facet plane having a crystal orientation different from that of each of a {0001} surface and surfaces forming the first and second side wall portions of the trench.

Thickness C1 of the epitaxial layer on the first side wall portion of the trench and thickness C2 of the epitaxial layer on the second side wall portion of the trench may satisfy a relationship of $0.8 \leq C1/C2 \leq 1.2$.

Further preferably, thickness C1 of the epitaxial layer on the first side wall portion of the trench and thickness C2 of the epitaxial layer on the second side wall portion of the trench satisfy a relationship of $0.9 \leq C1/C2 \leq 1.1$.

The substrate may be a silicon carbide substrate.

The off-direction may be, for example, a <11-20> direction, and the first and second side wall portions of the trench may include, for example, a {11-20} surface.

Each of the epitaxial layer and the semiconductor layer may be a silicon carbide layer, and the source electrode may include a first source electrode that is in contact with the source region on the off-angle upstream side of the trench, and a second source electrode that is in contact with the source region on the off-angle downstream side of the trench. The first and second source electrodes may each include an alloy layer that is in contact with the source region, and the alloy layer may be a silicide layer obtained by reaction of a metal with silicon carbide in the epitaxial layer and the source region.

The semiconductor layer further includes, for example, a trench for alignment mark. The epitaxial layer may be provided in the trench for alignment mark and on the main surface of the semiconductor layer in a region adjacent to the trench for alignment mark. The epitaxial layer is disposed on a third portion of the main surface of the semiconductor layer, which is situated on the off-angle upstream side of the trench for alignment mark, and on a fourth portion of the main surface of the semiconductor layer, which is situated on the off-angle downstream side of the trench, in the region adjacent to the trench for alignment mark. The semiconductor device may satisfy a relationship of TS>|TLm−TRm| where TLm is a maximum thickness of the epitaxial layer on the third portion, and TRm is a minimum thickness of the epitaxial layer on the fourth portion (TRm>0).

A method for manufacturing a semiconductor device as one aspect of the present disclosure includes providing a substrate with a semiconductor layer, which includes a substrate having a main surface inclined in an off-direction from a {0001} surface, and a semiconductor layer disposed on the main surface of the substrate. Here, the semiconductor layer includes a first conductive-type drift region, a second conductive-type body region which is disposed on the drift region and which is in contact with an upper surface of the semiconductor layer, and a first conductive-type source region which is disposed in the body region and which is in contact with the upper surface of the semiconductor layer. The manufacturing method further includes forming on the semiconductor layer a trench extending through the body region and the source region and having a bottom portion in the drift region. Here, a side wall of the trench includes first and second side wall portions facing each other, and each crossing the off-direction of the substrate. The manufacturing method further includes forming an epitaxial layer on the first and second side wall portions of the trench and on at least a part of a main surface of the source region. A growth rate in formation of the epitaxial layer is set to 3.0 μm/hr or less.

A growth rate in formation of the epitaxial layer may be set to, for example, 1.5 μm/hr or less.

The step of providing a substrate with a semiconductor layer may include forming a semiconductor layer on a substrate by epitaxial growth. A flow rate of a raw material gas supplied to the substrate in formation of the epitaxial layer may be lower than a flow rate of a raw material gas supplied to the substrate in formation of the semiconductor layer.

The raw material gas supplied to the substrate in formation of the epitaxial layer may include, for example, a monosilane gas and a propane gas. In the step of forming the epitaxial layer, the monosilane gas may be supplied to the substrate at a flow rate of, for example, 5 sccm or more and less than 30 sccm, and the propane gas may be supplied to the substrate at a flow rate of, for example, 2 sccm or more and less than 12 sccm.

In the step of forming the epitaxial layer, an epitaxial layer growth temperature may be set to, for example, 1400° C. to 1550° C. inclusive, an epitaxial layer growth pressure may be set to, for example, 5 hPa to 200 hPa inclusive, and a ratio (C/Si) of a number of C atoms to a number of Si atoms in the raw material gas supplied to the substrate may be set to, for example, 0.8 to 1.2 inclusive.

The substrate may be a silicon carbide substrate.

The off-direction may be, for example, a <11-20> direction, and at least one of the first and second side wall portions of the trench may include, for example, a {11-20} surface.

The epitaxial layer and the semiconductor layer may include, for example, silicon carbide, and the method may further include forming a source electrode including an alloy layer. The step of forming the source electrode may include: forming on the epitaxial layer a metal film containing a first metal; and reacting the first metal with silicon carbide in the epitaxial layer and the semiconductor layer to obtain an alloy layer which is in contact with the source region and which contains a silicide of the first metal.

First Exemplary Embodiment

<Description of Terms>
(a) Off-Angle and Off-Direction

The "off-angle" means an angle formed by a normal line to a main surface of a substrate and a c-axis direction of the substrate. An angle formed by a main surface of a substrate and a crystal plane (surface vertical to c-axis) may be referred to as an off-angle. For example, an angle formed by a main surface of a substrate and a <0001> surface is also referred to as an off-angle when a c-axis direction is a <0001> direction.

The "off-direction" is a direction in which a normal line to a main surface of a substrate is inclined in a <0001> direction. The "off-direction" means a direction of a projected vector in projection of a normal line vector of the main surface of the substrate to a crystal plane (surface vertical to c-axis). For example, when the c-axis direction is a <0001> direction, a direction of a projected vector in projection of a normal line vector of a main surface of a substrate to a {0001} surface is an off-direction.
(b) Off-Angle Upstream and Off-Angle Downstream The "off-angle upstream" and the "off-angle downstream" of a crystalline substrate having off-angle θ will be described with reference to FIG. 11.

Figure 10A:
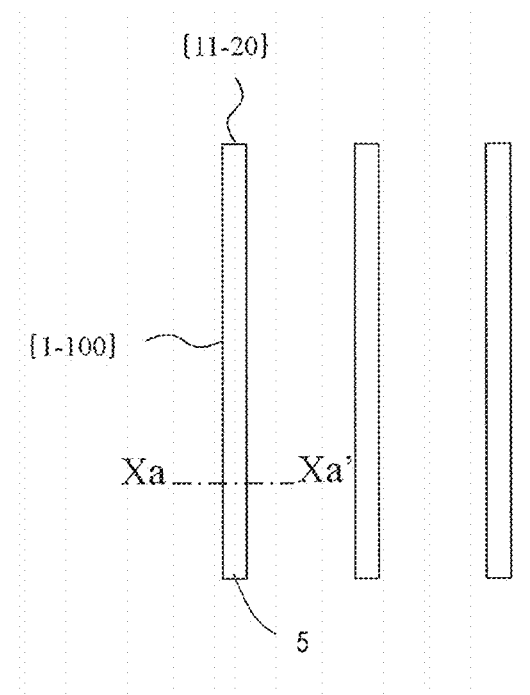
FIG. 10A is a plan view of a semiconductor layer (SiC layer) provided with a trench.
Figure 10B:
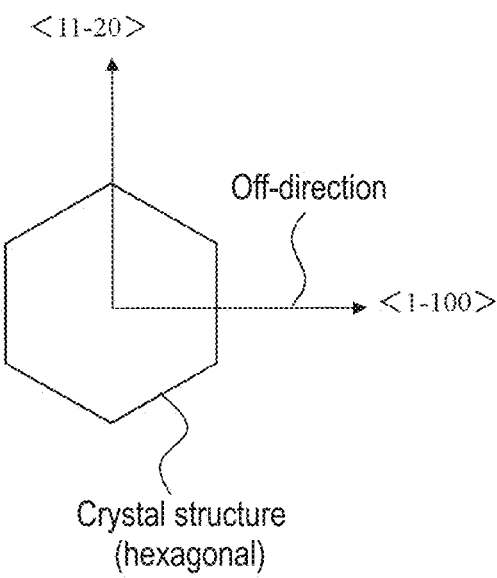
FIG. 10B is a schematic view showing a crystal direction in a crystal structure.
Figure 10C:
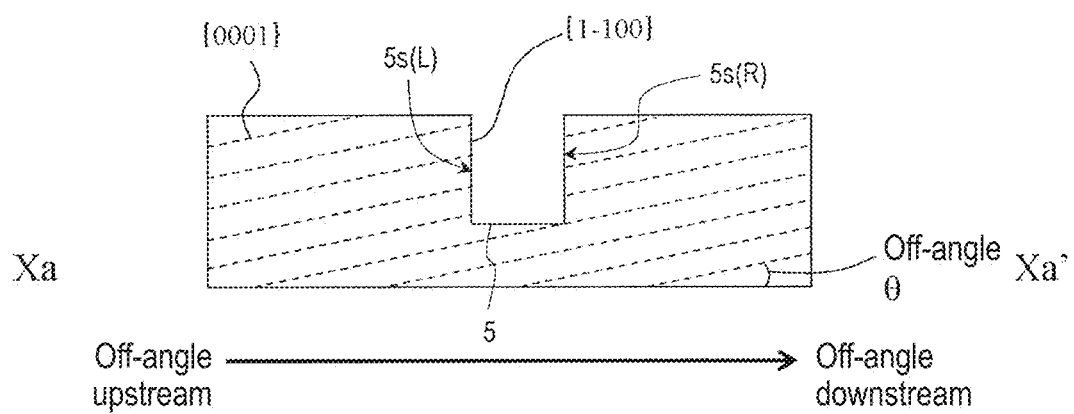
FIG. 10C is an enlarged sectional view taken along line Xa-Xa' in FIG. 10A.
Figure 11:
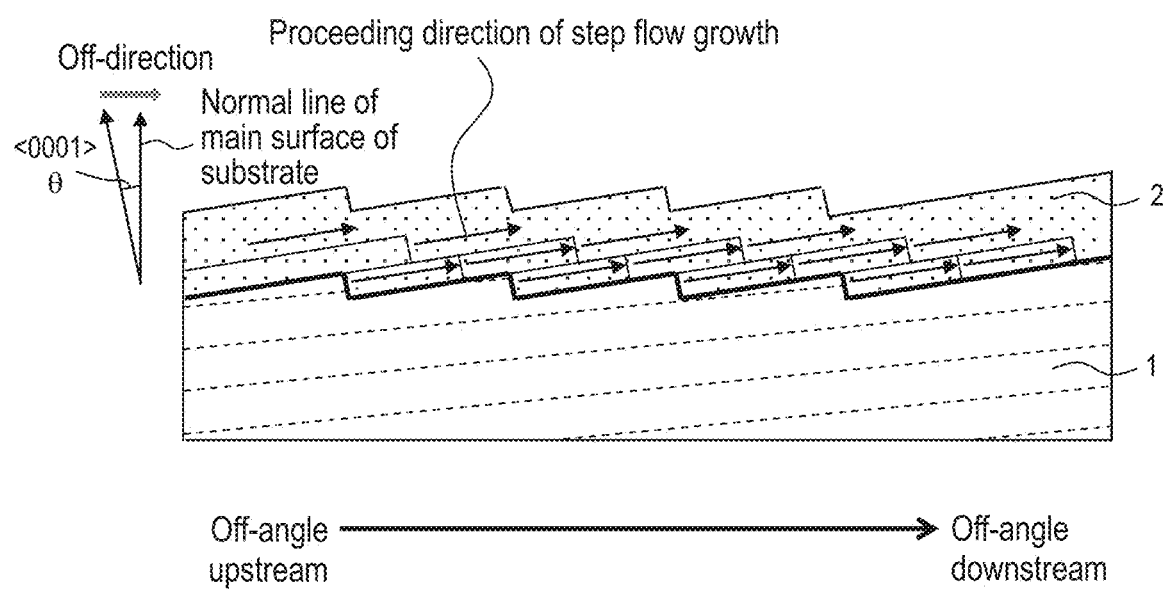
FIG. 11 is a schematic enlarged sectional view for explaining a proceeding direction of step flow (atom step) growth in an epitaxial growth process, and an off-angle upstream and off-angle downstream.

FIG. 11 is a sectional view schematically showing a process for forming semiconductor layer (e.g., SiC layer) 2 on a main surface of substrate 1 having off-angle θ while taking over off-angle θ. Substrate 1 has a surface (step structure surface) with a step density increased by inclining the surface by an angle of several degrees (off-angle θ) with respect to a {0001} surface. On the main surface of substrate 1, epitaxial growth proceeds in an off-direction through a step flow growth mode in which an atom step is formed. Epitaxial growth proceeds from a left side (upstream side) to a right side (downstream side) in FIG. 11, in a main surface of substrate 1 or semiconductor layer 2. When a cross-section is seen in such a manner that the {0001} surface rises to right, the left side corresponds to the "off-angle upstream" and the right side corresponds to the "off-angle downstream". In other words, a projected vector in projection of the off-direction to the main surface of the substrate is directed from the off-angle upstream to the off-angle downstream. Herein, the atomic step includes a step bunching in which a plurality of atomic steps overlap one another.
(c) Relationship between Off-Direction of Substrate and Surface Orientation of Channel Surface in Side Wall of Trench A relationship between an off-angle of a substrate and a surface orientation of a portion of a side wall of a trench on which a channel is formed (hereinafter, this portion is also referred to as a "channel surface") will be described with reference to FIGS. 9A to 10C.

Figure 9A:
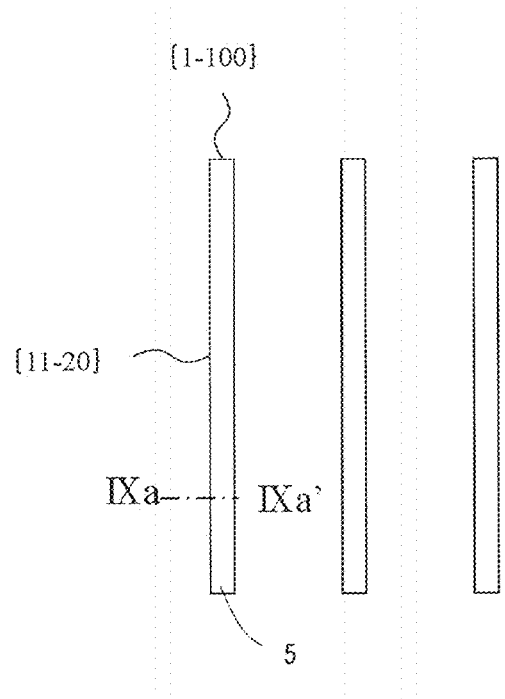
FIG. 9A is a plan view of a semiconductor layer (SiC layer) provided with a trench.
Figure 9B:
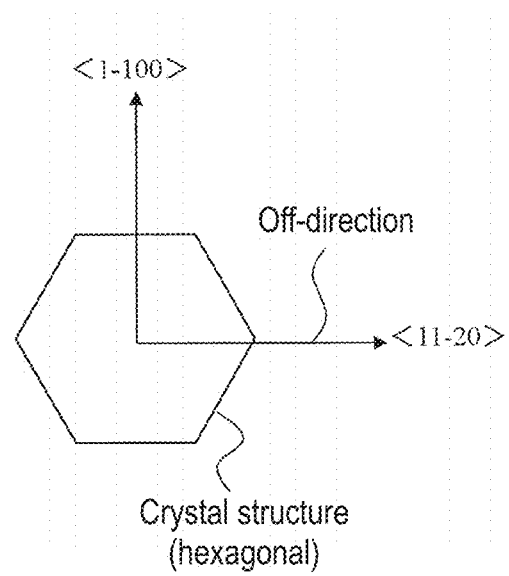
FIG. 9B is a schematic view showing a crystal direction in a crystal structure.
Figure 9C:
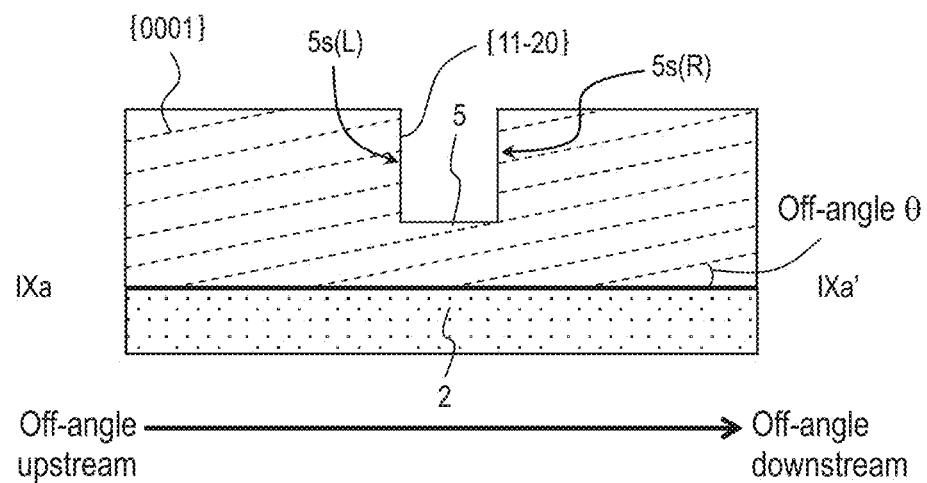
FIG. 9C is an enlarged sectional view taken along line IXa-IXa' in FIG. 9A.

FIGS. 9A to 10C are schematic views illustrating an off-direction of a substrate and a surface orientation of a channel surface of a trench. FIGS. 9A and 10A are plan views of trench 5 seen in a normal line direction of the substrate, FIGS. 9B and 10B are enlarged plan views showing an off-direction, and FIGS. 9C and 10C are sectional views crossing the channel surface of trench 5.

In the example shown in FIGS. 9A to 9C, a plurality of trenches 5 extending in a <1-100> direction are formed in parallel on a top of SiC layer 2 while keeping a distance from one another. The channel surface of trench 5 is formed by a {11-20} surface. In SiC layer 2, off-angle θ with respect to a {0001} surface is provided in a <11-20> direction. A direction in which a plurality of trenches 5 extend is a direction orthogonal to the off-direction of SiC layer 2 (substrate).

In the example shown in FIGS. 10A to 10C, a plurality of trenches 5 are formed so as to extend in the <11-20> direction. The channel surface of trench 5 is formed by a {1-100} surface. Off-angle θ of the substrate is set in the <1-100> direction.

Herein, for simplification of explanation, portion 5s(R) of a side wall of trench 5, which is situated on the off-direction side, in a cross-section vertical to main surface 1s (see. for example, FIG. 1A) of substrate 1 and parallel to the off-direction, and portion 5s(L) facing portion 5s(R) may be referred to as a "second side wall portion" and a "first side wall portion", respectively.

Trench 5 may have a polygonal (n-gonal) shape other than a rectangular shape in terms of a planar shape. Here, at least two of n side surfaces forming the side wall of trench 5 may face each other and cross the off-direction. Of these two surfaces, a surface situated on the off-angle upstream side forms "first side wall portion 5s(L)", and a surface situated on the off-angle downstream side forms "second side wall portion 5s(R)". Further, the planar shape of trench 5 may be a shape other than a polygonal shape, such as a circular shape or an elliptical shape. Here, for example, a portion of the side wall of trench 5, which is situated on the off-angle upstream side, in a cross-section vertical to main surface is of substrate 1 and parallel to the off-direction, corresponds to "first side wall portion 5s(L)", and a surface facing first side wall portion 5s(L) corresponds to "second side wall portion 5s(R)".

<Structure of Semiconductor Device>

Hereinafter, with reference to FIGS. 1A and 1B, a semiconductor device according to a first exemplary embodiment will be described with a silicon carbide semiconductor device shown as an example.

Semiconductor device 100 is a metal-insulator-semiconductor field effect transistor (MISFET) which is formed using a SiC semiconductor and which has a trench gate structure. Semiconductor device 100 typically includes a plurality of unit cells.

FIG. 1A is a schematic sectional view illustrating one unit cell in semiconductor device 100. FIG. 1B is a schematic plan view showing one example of a configuration in which a plurality of unit cells are disposed in semiconductor device 100. FIG. 1B illustrates three of the plurality of unit cells. FIG. 1A shows a cross-section taken along line Ia-Ia' in FIG. 1B.

Figure 1B:
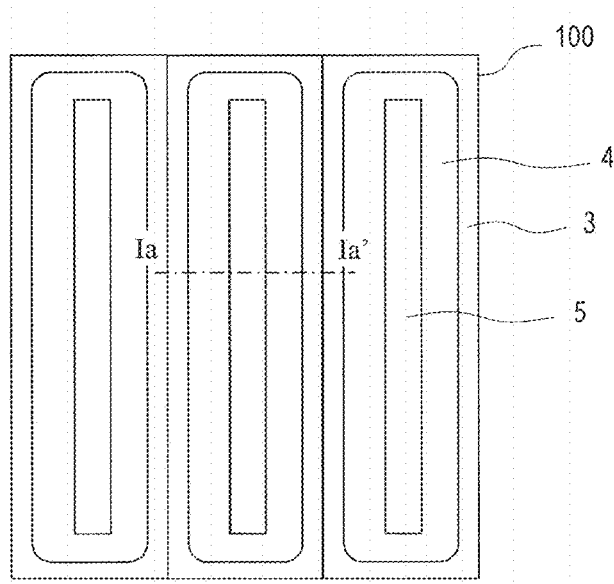
FIG. 1B is a plan view schematically showing the semiconductor device according to the first exemplary embodiment.

In FIG. 1B, body region 3, source region 4 and trench 5 are shown among constituent elements of semiconductor device 100, and other constituent elements are not illustrated. Here, a planar shape of a unit cell including trench 5 is an oblong shape, but the planar shape of the unit cell is not limited to an oblong shape, but may be a square shape. The planar shape of the unit cell may be other polygonal shape, a circular shape or the like. The number of unit cells is not particularly limited.

Semiconductor device 100 includes substrate 1 having main surface 1s inclined in an off-direction from a {0001} surface, and semiconductor layer 2 disposed on main surface is of substrate 1. In the first exemplary embodiment, for example, substrate 1 is a silicon carbide substrate, and semiconductor layer 2 is a silicon carbide (SiC) layer.

As substrate 1, a substrate composed of first conductive-type (n-type) SiC (also referred to simply as a SiC substrate) can be used. A broken line shown in substrate 1 denotes a {0001} just surface. The main surface and the {0001} just surface of the substrate form angle θ (off-angle). Main surface 1s of substrate 1 is, for example, a {0001} (silicon) surface having off-angle θ. Substrate 1 may be a substrate having as a main surface a surface having a {0001} surface and off-angle θ, or a SiC substrate having a C (carbon) surface as a main surface. Substrate 1 may be a substrate having any polytype structure. Here, as one example, a 4H-SiC substrate may be used in which the off-direction is a <11-20> direction and the off-angle is 4° with respect to, for example, the {0001} surface. The off-direction is not limited to the above, and may be a <1-100> direction, and the off-angle may be 8° or 2°, or other angle.

SiC layer 2 is an epitaxial growth layer formed on the main surface of substrate 1 by epitaxial growth. SiC layer 2 is not limited to an epitaxial layer.

SiC layer 2 has first conductive-type drift region 2d, second conductive-type body region 3, first conductive-type source region 4 and trench 5. An impurity concentration of drift region 2d is set to be lower than an impurity concentration of substrate 1. Body region 3 is disposed on drift region 2d. Body region 3 may be formed so as to be in contact with an upper surface of SiC layer 2. Source region 4 is situated on body region 3, and is in contact with the upper surface of SiC layer 2. Source region 4 may be disposed in body region 3 (e.g., a part of a surface region). Here, the first conductive-type and the second conductive-type are an n-type and a p-type, respectively. Here, the first conductive-type and the second conductive-type may be a p-type and an n-type, respectively.

In the example shown in FIG. 1A, a lower surface and a side surface of source region 4 are surrounded by body region 3. Body region 3 can be formed by, for example, implanting p-type impurity ions into SiC layer 2, and source region 4 can be formed by, for example, implanting n-type impurity ions into SiC layer 2.

Trench 5 is provided so as to extend through body region 3 and source region 4. Trench 5 has a bottom portion and a side wall which are situated in drift region 2d. In the example shown in FIGS. 1A and 1B, trench 5 has a rectangular planar shape. The side wall of trench 5 includes two surfaces (hereinafter, referred to "side wall portions") 5s(L), 5s(R) facing each other and each crossing the off-direction of substrate 1. Where in a direction projected on main surface is of substrate 1, an upstream side is an off-angle upstream side, and a downstream side is an off-angle downstream side, side wall portion 5s(L) situated on the off-angle upstream side and side wall portion 5s(R) situated on the off-angle downstream side, of the above-mentioned side wall portions, are referred to as a "first side wall portion" and a "second side wall portion", respectively. First and second side wall portions 5s(L), 5s(R) may extend in parallel to each other. The off-direction may be, for example, a <11-20> direction, and at least one of first and second side wall portions 5s(L), 5s(R) may include, for example, a {11-20} surface.

Epitaxial layer 12 is disposed so as to cover an inside of trench 5 and a part of a main surface of source region 4. Epitaxial layer 12 is, for example, a first conductive-type (n-type) SiC epitaxial layer. In an illustrated example, epitaxial layer 12 covers the whole side wall and a bottom surface of trench 5, but epitaxial layer 12 may be disposed at least on first side wall portion 5s(L) and second side wall portion 5s(R) of trench 5, and on a part of the main surface of source region 4. Portions of epitaxial layer 12, which are situated on first side wall portion 5s(L) and on second side wall portion 5s(R), each include a region in which a channel is formed.

In trench 5, gate insulating film 8 is formed so as to cover at least epitaxial layer 12 formed on the side wall of trench 5. In a MISFET, a region near an interface (MIS interface) between epitaxial layer 12 and gate insulating film 8, on a part of the side wall of trench 5 (side wall of body region 3), is a "channel region". Gate insulating film 8 may be, for example, a so called thermal oxide film formed by thermal oxidation, such as silicon oxide film or a silicon oxide film containing nitrogen (N), or may be a deposited insulating film.

Gate electrode 9 is provided on gate insulating film 8 formed in trench 5. Gate electrode 9 may be formed so as to cover at least a portion of gate insulating film 8, which is situated on a side wall of body region 3. Here, as one example, gate electrode 9 is formed so as to fill trench 5. Therefore, gate electrode 9 and SiC layer 2 are insulated by gate insulating film 8.

On SiC layer 2, source electrodes 10(L), 10(R) that apply a common potential to body region 3 and source region 4 are disposed so as to be in contact with both body region 3 and source region 4. Source electrode 10(L) is provided on the off-angle upstream side of trench 5, and source electrode 10(R) is provided on off-angle downstream side of trench 5. Source electrodes 10(L), 10(R) each include alloy layer 10a that is in contact with SiC layer 2.

Drain electrode 11 is disposed on a surface (back surface) of substrate 1 which is opposite to SiC layer 2.

In the first exemplary embodiment, epitaxial layer 12 is formed not only in trench 5 but also on the main surface of source region 4. Specifically, epitaxial layer 12 is disposed on first portion 4s(L) of the main surface of source region 4 which is situated on the off-angle upstream side of trench 5 and on second portion 4s(R) of the main surface of source region 4 which is situated on the off-angle downstream side of trench 5, in a region adjacent to the trench (trench-adjacent region). The "trench-adjacent region" is a region which is situated near a peripheral edge of trench 5 when seen in a normal line direction of main surface 1s of substrate 1 in a unit cell including trench 5. The trench-adjacent region is, for example, region R extending from the peripheral edge of trench 5 to an end portion of each of source electrodes 10(L), 10(R).

Absolute value |TL−TR| of a difference between maximum thickness TL of epitaxial layer 12 on first portion 4s(L) and minimum thickness TR (TR>0) of epitaxial layer 12 on second portion 4s(R) is less than thickness TS of source region 4 (TS>|TL−TR|). More preferably, absolute value |TL−TR| is less than ½ of thickness TS of source region 4 (TS/2>|TL−TR|).

Here, thickness TS of source region 4 is a thickness between the main surface of source region 4 (i.e. upper surface of SiC layer 2) and a lower surface of source region 4. Source region 4 is, for example, a region having a first conductive-type impurity concentration of $5 \times 10^{18}$ cm$^{-3}$ or more. When source region 4 is formed by implanting a first conductive-type impurity into body region 3, the first conductive-type impurity concentration of source region 4 is lower at a greater depth above a predetermined depth. In this case, the lower surface of the source region is situated at a position where the dopant concentration reaches $5 \times 10^{18}$ cm$^{-3}$.

Semiconductor device 100 includes a channel layer (epitaxial layer 12), and is therefore called a accumulation-mode MISFET. Operations of the accumulation-mode MISFET are partially different from operations of a MISFET (inversion-mode MISFET) which does not include a channel layer. For example, in an off-state in which a bias voltage lower than a threshold voltage is applied to gate electrode 9, the semiconductor device is in a depletion state in which the channel layer is depleted by a p-n junction of the channel layer and body region 3, so that a current does not pass (off-state). In an on-state in which a bias voltage equal to or higher than a threshold voltage is applied to gate electrode 9, the semiconductor device is in a accumulation state in which electrons are stored in a high concentration in first conductive-type channel layer 12, so that a current passes (on-state).

In semiconductor device 100 according to the first exemplary embodiment, the thickness of epitaxial layer 12 is adjusted so that absolute value (|TL−TR|) of a difference in thickness of epitaxial layer 12 on the source region main surface between the off-angle downstream side and the off-angle upstream side of trench 5 is less than thickness TS of source region 4. Thus, a variation in thickness of epitaxial layer 12 are suppressed, and therefore it is easy to situate a bottom portion of alloy layer 10a of source electrode 10 in source region 4 on both the off-angle upstream side and the off-angle downstream side of trench 5. This advantage will be described in more detail with reference to drawings.

In a conventional accumulation-mode MISFET, the thickness of epitaxial layer 112 considerably varies between the off-angle downstream side and the off-angle upstream side of trench 5 as described above with reference to FIG. 12C. There is a case where a metal film is formed on epitaxial layer 112, and the metal film is reacted with epitaxial layer 112 and SiC layer 2 to form source electrodes 10(L), 10(R) containing alloy layer 10a, respectively, on the off-angle upstream side and the off-angle downstream side of trench 5. In this case, there is a possibility that alloy layer 10a of source electrode 10(L) is not formed so as to extend to source region 4 on the off-angle upstream side of trench 5 even when a lower surface of source electrode 10(R) (lower surface of alloy layer 10a) is situated in source region 4 on the off-angle downstream side of trench 5. Thus, contact resistance of source electrode 10(L) and source region 4 may increase. On the other hand, there is a possibility that alloy layer 10a of source electrode 10(R) extends to body region 3 below source region 4 on the off-angle downstream side of trench 5 even when the lower surface of source electrode 10(L) (lower surface of alloy layer 10a) is situated in source region 4 on the off-angle upstream side of trench 5. Thus, contact resistance of source electrode 10(R) and source region 4 may increase. Thus, in the conventional MISFET, it is difficult to suppress a variation in contact resistance of source electrode 10(R), 10(L) and the source region.

On the other hand, in the first exemplary embodiment, a variation in thickness of epitaxial layer 12 between the off-angle upstream side and the off-angle downstream side of trench 5 is kept less than the thickness of source region 4. Thus, it is easy to form source electrodes 10(L) and 10(R) in such a manner that the lower surfaces of alloy layers 10a of these source electrodes are situated in source region 4. Therefore, in each unit cell, a variation in contact resistance between the off-angle upstream side and the off-angle downstream side of trench 5 can be suppressed. As a result, a trench-type MISFET which has small on-resistance, and can be fed with a large current can be provided. More preferably, absolute value (|TL−TR|) of a difference in thickness of epitaxial layer 12 between the off-angle upstream side and the off-angle downstream side of trench 5 is less than ½ of thickness TS of source region 4. Accordingly, when a lower surface of an alloy layer (silicide layer) in one source electrode is situated near a center of source region 4 in a thickness direction (depth from an upper surface of source region 4: TS/2), a lower surface of an alloy layer in the other source electrode can be more reliably disposed in the source region.

In the conventional accumulation-mode MISFET, an amount of a raw material consumed on the main surface of SiC layer 2 in formation of epitaxial layer 112 varies between the off-angle upstream side and the off-angle downstream side of trench 5 as described above. As a result, the thickness of epitaxial layer 112 on the first side wall forming a channel surface of trench 5 may be different from the thickness of epitaxial layer 112 on the second side wall forming a channel surface of trench 5, and therefore there is a possibility that a variation in gate threshold voltage occurs between the off-angle upstream side and the off-angle downstream side.

On the other hand, according to the first exemplary embodiment, a difference in amount of a raw material consumed on the main surface of SiC layer 2 in formation of epitaxial layer 12 can be reduced. Thus, a difference between thickness C1 of epitaxial layer 12 on first side wall portion 5s(L) of trench 5 and thickness C2 of epitaxial layer 12 on second side wall portion 5s(R) of trench 5 can be reduced. For example, thickness C1 of epitaxial layer 12 on first side wall portion 5s(L) of trench 5 and thickness C2 of epitaxial layer 12 on second side wall portion 5s(R) of trench 5 satisfy preferably a relationship of $0.8 \leq C1/C2 \leq 1.2$, more preferably a relationship of $0.9 \leq C1/C2 \leq 1.1$. Accordingly, occurrence of a variation in gate threshold voltage between the off-angle upstream side and the off-angle downstream side of trench 5 can be suppressed.

<Description of Constituent Elements>

Epitaxial layer 12 is, for example, a first conductive-type (n-type) epitaxial layer. Epitaxial layer 12 has a carrier concentration of, for example, $1 \times 10^{18}$ cm$^{-3}$ and a thickness of, for example, 20 nm. Epitaxial layer 12 formed on the side wall of trench 5 has crystallinity superior to crystallinity of the side wall surface of trench 5 after formation of trench 5. Thus, improvement of a channel mobility of carriers on the side wall (channel surface) of trench 5 can be expected.

When a normally-off-type MISFET is prepared, a carrier concentration and thickness of epitaxial layer 12 may be set in such a manner that whole epitaxial layer 12 is completely depleted by a p-n junction with body region 3. For example, when body region 3 has a carrier concentration of $1\times10^{18}$ cm$^{-3}$, epitaxial layer 12 may have a carrier concentration of $2\times10^{18}$ cm$^{-3}$ and a thickness of about 20 nm. When body region 3 has a carrier concentration of $1\times10^{19}$ cm$^{-3}$, the epitaxial layer may have a carrier concentration of $2\times10^{18}$ cm$^{-3}$ and a thickness of about 35 nm. Epitaxial layer 12 may have a single-layer structure, or a multi-layered structure. The thickness of epitaxial layer 12 may be appropriately adjusted according to a design value of the gate threshold voltage.

Source electrode 10 includes first source electrode 10(L) that is in contact with source region 4 on the off-angle upstream side of trench 5, and second source electrode 10(R) that is in contact with source region 4 on the off-angle downstream side of trench 5. Source electrodes 10(L), 10(R) may each include alloy layer 10a that is in contact with source region 4. Alloy layer 10a may be a silicide layer obtained by reaction of a metal with silicon carbide in epitaxial layer 12 and source region 4. In this example, source electrodes 10(L), 10(R) each include metal layer 10b containing a first metal, and alloy layer 10a situated between metal layer 10b and source region 4. Alloy layer 10a contains a silicide of the first metal. Alloy layer 10a may be, for example, a silicide layer obtained by reaction of the first metal with silicon carbide in epitaxial layer 12 and source region 4.

Source electrodes 10(L), 10(R) can be formed, for example, in a manner as described below. First, metal layer 10b is formed on a predetermined region of epitaxial layer 12. Metal layer 10b is provided on each of the off-angle upstream side and the off-angle downstream side of trench 5. An annealing treatment is then performed. Here, at least a part of a metal (e.g., nickel) contained in metal layer 10b reacts with a silicon component in epitaxial layer 12 and SiC layer 2 to form alloy layer (metal silicide layer) 10a. Metal layer 10b composed of a metal that has not reacted with the silicon component may remain on alloy layer 10a. Alloy layer 10a forms an ohmic contact with source region 4 and body region 3 of SiC layer 2. Here, when alloy layer 10a does not extend to source region 4, or extends to body region 3 below source region 4, an amount of a contact resistance component of source electrodes 10(L), 10(R) and source region 4 increases. For avoiding such a situation, source electrodes 10(L), 10(R) disposed on the off-angle upstream side and the off-angle downstream side of trench 5 may be each formed in such a manner that the bottom portion of alloy layer 10a is situated in source region 4.

In the example shown in FIG. 1A, trench 5 has a forward tapered shape, but may have a reverse tapered shape. Alternatively, first and second side wall portions 5s(L), 5s(R) of trench 5 may be vertical to main surface 1s of substrate 1. Angle α (see FIG. 2B) of the trench side wall with respect to main surface is of substrate 1 may be, for example, about 80 to 90°.

Connection portion 5B between the bottom surface and the side wall of trench 5 is referred to as a "lower corner portion", and connection portion 5T between the upper surface of SiC layer 2 and the side wall of trench 5 is referred to as an "upper corner portion". One or both of upper corner portion 5T and lower corner portion 5B may have a round shape. The "round shape" is a roundish shape, for example a curved shape having a curvature radius of 0.1 μm or more in the sectional view shown in FIG. 1A. Trench 5 having a round shape can be formed by annealing trench 5, which is formed on SiC layer 2 by etching etc., at a temperature of about 1450° C. to 1700° C. The annealing causes surface diffusion of SiC, so that upper corner portion 5T and lower corner portion 5B of trench 5 are rounded.

SiC layer 2 may be provided with a trench for alignment mark (not illustrated) in addition to trench 5. Epitaxial layer 12 may be provided in the trench for alignment mark and on the main surface of SiC layer 2 in a region adjacent to the trench for alignment mark. In the region adjacent to the trench for alignment mark, epitaxial layer 12 may be disposed on a third portion of the main surface of SiC layer 2, which is situated on the off-angle upstream side of the trench for alignment mark, and on a fourth portion of the main surface of SiC layer 2, which is situated on the off-angle downstream side of the trench. In this case, it is preferable that the semiconductor device satisfies a relationship of TS>|TLm−TRm| where TLm is a maximum thickness of epitaxial layer 12 on the third portion, and TRm is a minimum thickness of the epitaxial layer on the fourth portion (TRm>0). In a conventional semiconductor device, a trench for alignment mark may lose its shape due to formation of an epitaxial layer (see FIG. 12C). On the other hand, in the first exemplary embodiment, a difference in thickness of epitaxial layer 12 can be reduced, and therefore the trench for alignment mark can be inhibited from losing its shape due to formation of epitaxial layer 12. Therefore, deterioration of alignment accuracy in a lithography process can be suppressed.

<Method for Manufacturing Semiconductor Device>

Hereinafter, one example of a method for manufacturing semiconductor device 100 according to the first exemplary embodiment will be described with reference to the drawings.

FIGS. 2A to 6 are process sectional views for explaining one example of the method for manufacturing semiconductor device 100.

Figure 2A:
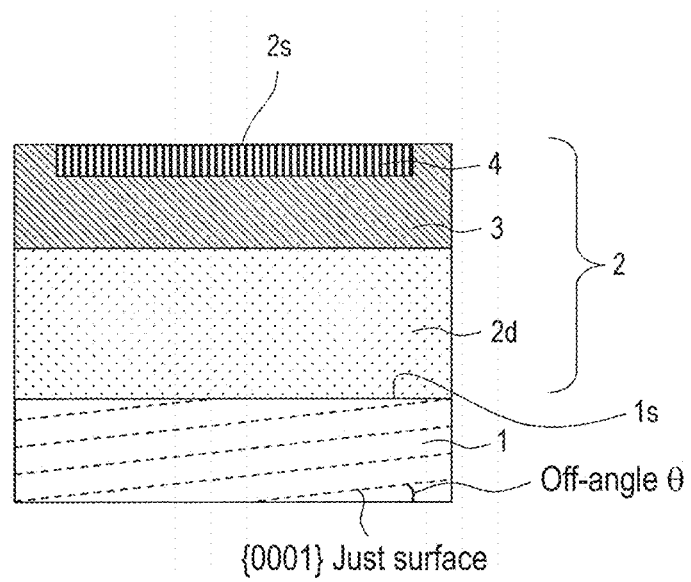
FIG. 2A is a schematic process sectional view for explaining a method for manufacturing a semiconductor device according to the first exemplary embodiment.

First, SiC layer 2 including drift region 2d, body region 3 and source region 4 is formed on main surface 1s of substrate 1 having off-angle θ as shown in FIG. 2A.

As substrate 1, for example, a first conductive-type (n-type) 4H-SiC substrate having off angle θ of 4° with respect to a {0001} surface is used. An off-direction is, for example, a <11-20> direction.

SiC layer 2 is formed in a manner as described below. First, n-type SiC layer 2 is formed on main surface 1s of substrate 1 by, for example, a chemical vapor deposition (CVD) method which is capable of performing epitaxial growth. SiC layer 2 has a carrier concentration of, for example, $8\times10^{15}$ cm$^{-3}$ and a thickness of, for example, 12 μm. As an n-type dopant, for example, nitrogen (N) ions can be used.

Here, SiC layer 2 is formed by epitaxial growth. Conditions for epitaxial growth are not particularly limited, but generally, conditions are set so as to achieve a growth rate of 5 μm to 10 μm inclusive. For example, a silicon-based gas such as, for example, a monosilane (SiH$_4$) gas, and a carbon-based gas such as, for example, a propane (C$_3$H$_8$) gas are each supplied in an amount of 30 sccm to 60 sccm inclusive, and a C/Si ratio (ratio of a number of C atoms to a number of Si atoms in a supplied gas) is set to, for example, 1.0 to 1.8 inclusive. A growth pressure is set to 100 hPa to 300 hPa inclusive. A substrate temperature is set to, for example, 1500° C. to 1650° C. inclusive.

Subsequently, second conductive-type (p-type) body region 3 is formed on a top of SiC layer 2. Body region 3 has a carrier concentration of, for example, $1\times10^{18}$ cm$^{-3}$ and a thickness of, for example, 1.2 µm. Body region 3 is obtained by, for example, ion-implanting a p-type dopant into n-type SiC layer 2 obtained by the above-mentioned method. As the p-type dopant, for example, aluminum (Al) ions etc. may be used. A region of SiC layer 2, which excludes a portion provided with body region 3, is drift region $2d$. Body region 3 may be formed by epitaxially growing silicon carbide while supplying trimethylaluminum (TMA) etc. as a p-type dopant onto n-type SiC layer 2.

Subsequently, n-type source region 4 is selectively formed on a top of body region 3. Source region 4 has a carrier concentration of, for example, $5 \times 10^{19}$ cm$^{-3}$ and a thickness of, for example, 0.2 µm. Source region 4 is obtained by implanting N ions etc. as a n-type dopant into body region 3 using, for example, a mask film (not illustrated) formed on SiC layer 2 and composed of silicon oxide, polysilicone or the like.

After the ions are implanted, an annealing treatment is performed at a temperature of 1700° C. for 30 minutes in, for example, an inert gas atmosphere. The annealing treatment activates impurity ions implanted into body region 3 and source region 4. Body region 3 may include a contact region containing a p-type impurity in a high concentration.

Figure 2B:
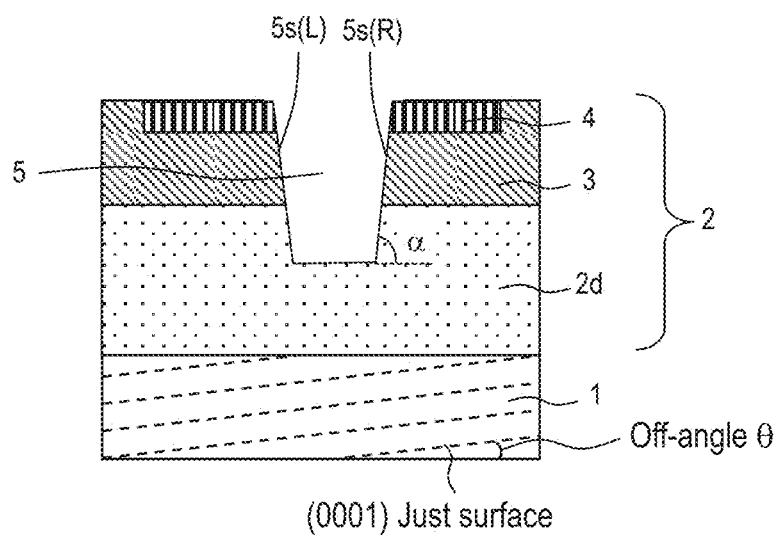
FIG. 2B is a schematic process sectional view for explaining the method for manufacturing a semiconductor device according to the first exemplary embodiment.

Next, trench 5 is formed on SiC layer 2 as shown in FIG. 2B. Here, trench 5 is formed in such a manner that trench 5 extends through source region 4 and body region 3 until the bottom portion of trench 5 reaches drift region $2d$.

Specifically, a mask film (not illustrated) which is composed of, for example, a plasma oxide film etc. and has on source region 4 an opening pattern for formation of a trench is first formed by a lithography method and an etching method. Reactive ion etching (RIE) is performed using the mask film. Accordingly, trench 5 having a depth of, for example, 1.5 µm and a width of, for example, 1 µm is formed on SiC layer 2. For example, a portion of the side wall of trench 5, which forms a channel surface, may be disposed so as to vertically cross the off-direction of substrate 1. In the first exemplary embodiment, trench 5 having a stripe shape (oblong shape) when seen in the normal line direction of substrate 1 is formed. Side surfaces $5s$(L), $5s$(R) extending longitudinally, among side surfaces of trench 5, are disposed so as to vertically cross the off-direction. Of these side surfaces, a surface on the off-angle upstream side and a surface on the off-angle downstream side are defined as first side wall portion $5s$(L) and second side wall portion $5s$(R), respectively. Here, first and second side wall portions $5s$(L) and $5s$(R) is formed by a surface similar to a {11-20} surface.

In the example shown in FIG. 2B, the side walls of trench 5 have a forward tapered shape which increases a width as going upward with respect to the main surface of substrate 1. As one example, taper angle α of each of first and second side wall portions $5s$(L), $5s$(R) with respect to main surface is of substrate 1 is 85°.

The side walls of trench 5 are not required to have a forward tapered shape. The side walls of trench 5 may be vertical to the main surface of substrate 1, or may have a reverse tapered shape which increases a width as going downward. When the off-direction of substrate 1 is a <1-100> direction, trench 5 may be disposed in such a manner that the side wall of trench 5 includes a side surface (side wall portion) formed by a {1-100} surface as described above with reference to FIG. 10B.

Figure 3A:
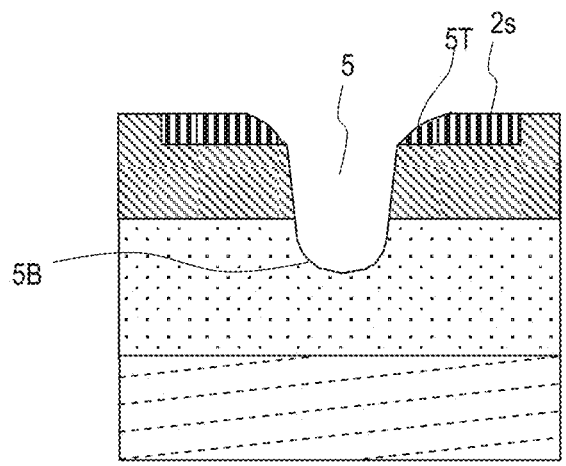
FIG. 3A is a schematic process sectional view for explaining the method for manufacturing a semiconductor device according to the first exemplary embodiment.

Next, upper corner portion 5T and lower corner portion 5B of trench 5 are deformed into a roundish round shape as shown in FIG. 3A. Here, SiC layer 2 is subjected to an annealing treatment. The annealing treatment causes surface diffusion of a part of silicon carbide (SiC) which forms upper corner portion 5T and lower corner portion 5B of trench 5, so that upper corner portion 5T and lower corner portion 5B are rounded. By rounding upper corner portion 5T and lower corner portion 5B, embedability of the gate electrode as described later can be improved.

Specifically, for example, substrate 1 provided with SiC layer 2 including source region 4, body region 3 and drift region $2d$ is subjected to an annealing treatment under conditions of a temperature of 1550° C. and a pressure of 200 hPa in an argon (Ar) gas atmosphere. An annealing time is, for example, 16 minutes. This step may be continuously carried out using a CVD apparatus just before formation of a next epitaxial layer.

An angle of the side wall of trench 5 can also be corrected by optimally adjusting annealing conditions (not illustrated). Accordingly, a {11-20} just surface can be given to at least one of two side surfaces (first and second side wall portions) of side walls of trench 5, which form channel surfaces. In this example, the first side wall portion includes a {11-20} just surface.

Figure 3B:
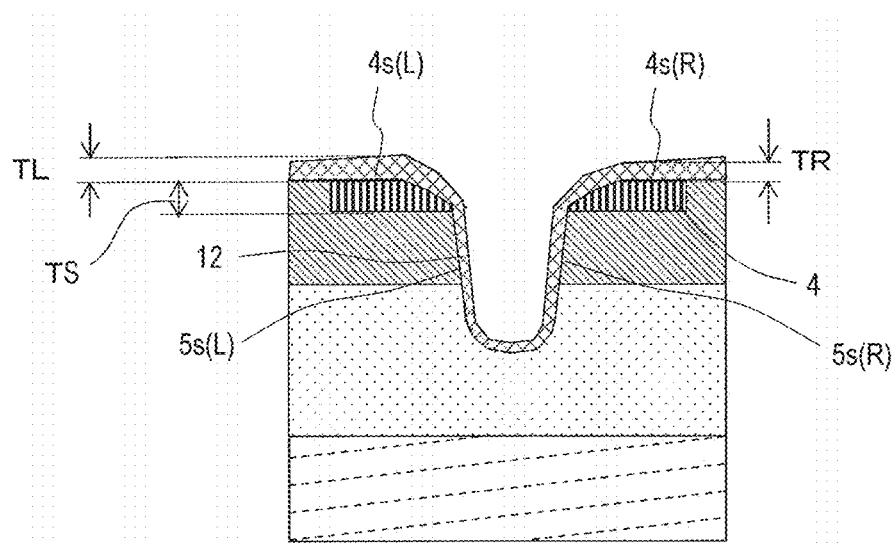
FIG. 3B is a schematic process sectional view for explaining the method for manufacturing a semiconductor device according to the first exemplary embodiment.

Next, epitaxial layer 12 is formed so as to cover tops of first and second side wall portions $5s$(L), $5s$(R) of trench 5 and main surfaces $4s$(L), $4s$(R) of the source region in a region adjacent to trench 5 as shown in FIG. 3(B).

In the first exemplary embodiment, epitaxial growth conditions for forming epitaxial layer 12 are optimally adjusted to suppress generation of a {0001} facet on the off-angle downstream side of trench 5. Accordingly, a variation in thickness of epitaxial layer 12 between the off-angle upstream side and the off-angle downstream side of trench 5 can be suppressed. Specifically, epitaxial layer 12 is formed under conditions which ensure that an absolute value of a difference between thickness TL of epitaxial layer 12 on first portion $4s$(L) of the main surface of source region 4 which is situated on the off-angle upstream side of trench 5 and thickness TR of epitaxial layer 12 on second portion $4s$(R) of the main surface of source region 4 which is situated on the off-angle downstream side of trench 5, in a trench-adjacent region, is less than the thickness of source region 4. The "main surface of source region 4" is a portion of the upper surface of source region 4 which is situated on the main surface of SiC layer 2. The main surface of source region 4 has a first conductive-type impurity concentration of, for example, $1 \times 10^{19}$ cm$^{-3}$ or more.

Here, an epitaxial film is grown on the main surface of SiC layer 2 at a low growth rate of 3 µm/hr or less, more preferably 1.5 µm/hr or less using a chemical vapor deposition (CVD) apparatus. The growth rate is an average of growth rates on the main surface of SiC layer 2. Specifically, a silicon-based gas such as, for example, a monosilane (SiH$_4$) gas, and a carbon-based gas such as, for example, a propane (C$_3$H$_8$) gas are used as raw material gases. For example, the monosilane gas is supplied onto SiC layer 2 at a flow rate of 5 sccm or more and less than 30 sccm, and the propane gas is supplied onto SiC layer 2 at a flow rate of 2 sccm or more and less than 12 sccm to perform epitaxial growth. A growth temperature is set to, for example, 1400° C. to 1550° C. inclusive, and a growth pressure is set to, for example, 10 to 250 hPa. A C/Si ratio (ratio of a number of C atoms to a number of Si atoms in the raw material gas supplied) may be set to, for example, 0.8 to 1.2. A H/Si ratio (ratio of a number of H atoms to a number of Si atoms in the raw material gas supplied) may be set to 1000 to 100000.

When supply flow rates of raw materials such as a monosilane gas and a propane gas are set to be lower than supply flow rates in formation of SiC layer 2, the growth rate can be reduced. Here, by setting supply flow rates of the monosilane gas and the propane gas within a range as described above, the growth rate can be reduced to, for example, 3 µm/hr or less.

One of factors of promoting generation of a {0001} facet plane may be generation of a step bunching. The step bunching is easily generated when a raw material is excessively supplied to a substrate surface. When the raw material excessively exists, SiC is formed before the raw material arrives at a step, and therefore two-dimensional nucleus growth is apt to occur rather than a step flow. Accordingly, by decreasing a supply amount of the raw material to reduce the growth rate to, for example, 3 µm/hr or less, the {0001} facet can be reduced.

The step bunching is easily generated when the growth temperature is high. For suppressing generation of the step bunching, it is preferable to set the growth temperature to, for example, 1550° C. or lower. When the growth temperature is excessively low, polycrystalline SiC may be generated, leading to an increase in amount of particles. Therefore, it is preferable to set the growth temperature to, for example, 1400° C. or higher.

For further suppressing generation of the step bunching, it is also effective to promote surface diffusion. When the growth pressure is set to be low (e.g., 10 hPa to 250 hPa inclusive), surface diffusion can be promoted to suppress the step bunching, leading to reduction of the {0001} facet.

Figure 4A:
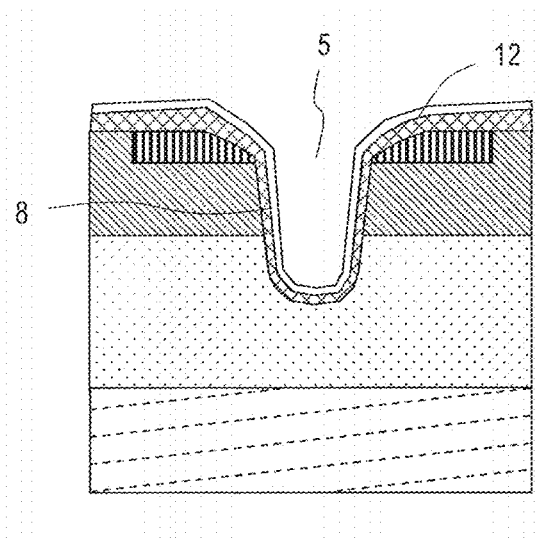
FIG. 4A is a schematic process sectional view for explaining the method for manufacturing a semiconductor device according to the first exemplary embodiment.

Next, gate insulating film 8 is formed in trench 5 as shown in FIG. 4A. Gate insulating film 8 is formed so as to cover at least epitaxial layer 12 formed on the side wall of trench 5.

For example, gate insulating film 8 is formed in a manner as described below. First, substrate 1 having trench 5 is washed. Thereafter, for example, substrate 1 is placed in a thermal oxidation furnace, and subjected to a thermal oxidation treatment at 1200° C. for 0.5 hours in a dry oxidizing atmosphere. Accordingly, as gate insulating film 8, a silicon oxide film being a thermal oxide film is formed so as to extend from the upper surface of body region 3 and the upper surface of source region 4 onto the side wall and bottom surface of trench 5. Gate insulating film 8 may be a deposition insulating film formed by a chemical vapor deposition (CVD) method, a sputtering method or the like.

Figure 4B:
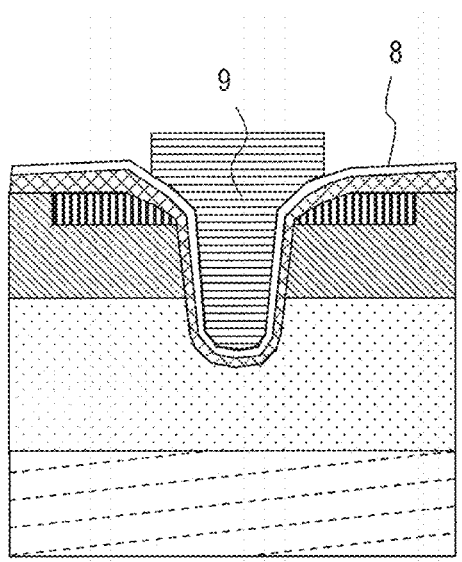
FIG. 4B is a schematic process sectional view for explaining the method for manufacturing a semiconductor device according to the first exemplary embodiment.

Next, gate electrode 9 is formed so as to be embedded in trench 5 with gate insulating film 8 interposed between trench 5 and gate electrode 9 as shown in FIG. 4B.

For example, gate electrode 9 is formed in a manner as described below. First, using a low-pressure CVD (LP-CVD) method, a polysilicon film doped with phosphorus (P) is deposited in a thickness of, for example, 1000 nm on a whole surface of a wafer which is provided with gate insulating film 8. Subsequently, a rapid thermal annealing (RTA) treatment is performed at a temperature of 1000° C. for 60 seconds in, for example, an inert gas atmosphere to activate doped phosphorus. Thereafter, for example a resist film (not illustrated) for masking a gate electrode-formed region is formed on the polysilicon film using a lithography method and an etching method. Subsequently, gate electrode 9 is formed by etching the polysilicon film with the resist film as a mask using a RIE method. Gate electrode 9 may be formed in at least a region of trench 5 which faces body region 3, and gate electrode 9 does not necessarily have a shape as shown in FIG. 4B. For example, gate electrode 9 is not required to be embedded in a whole of trench 5.

Figure 5A:
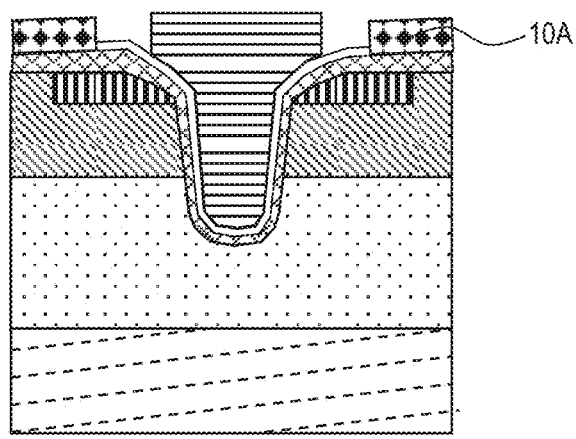
FIG. 5A is a schematic process sectional view for explaining the method for manufacturing a semiconductor device according to the first exemplary embodiment.

Next, conductive film 10A is formed in such a manner that conductive film 10A is kept at a distance from gate electrode 9, and is in contact with body region 3 and source region 4 as shown in FIG. 5A. Conductive film 10A is disposed on SiC layer 2 so as to extend across body region 3 and source region 4.

Specifically, first an interlayer insulating film (not illustrated) is formed so as to cover SiC layer 2 and gate electrode 9 using a CVD method or the like. Subsequently, using a lithography method and an etching method, the interlayer insulating film is provided with an opening that exposes a surface of SiC layer which includes an interface portion between source region 4 and body region 3. Thereafter, using a sputtering method or the like, for example a conductive film 10A is formed in the opening provided in the interlayer insulating film. Conductive film 10A may be a metal film containing a metal (first metal) such as Ti or Ni.

Figure 5B:
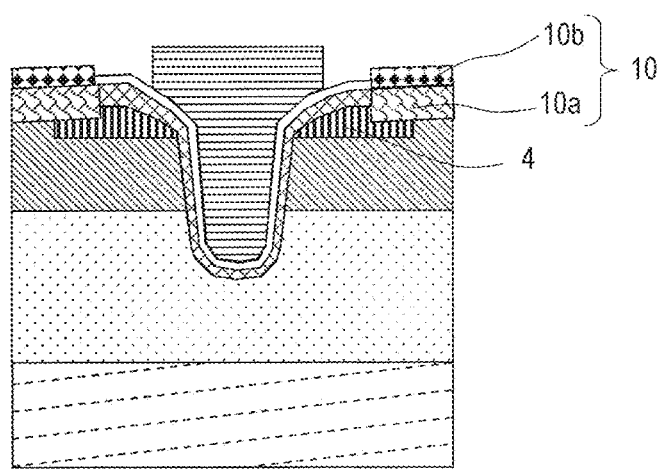
FIG. 5B is a schematic process sectional view for explaining the method for manufacturing a semiconductor device according to the first exemplary embodiment.

Next, the metal contained in conductive film 10A is silicidated to form source electrode 10 including alloy layer 10a as shown in FIG. 5B.

As a method for silicidation, for example, an annealing treatment is performed in an inert gas atmosphere and at a temperature of 950° C. for about 1 minute. Accordingly, the first metal in conductive film 10A reacts with silicon carbide in epitaxial layer 12 and source region 4 to form alloy layer 10a. A portion of conductive film 10A which has not reacted with silicon carbide may remain as metal layer 10b. Here, when alloy layer 10a does not extend to source region 4, or alloy layer 10a extends to below the lower surface of source region 4, an amount of a contact resistance component of source region 4 and source electrode 10 increases. Thus, a temperature and a treatment time for the annealing treatment are appropriately adjusted so that the bottom portion of alloy layer 10a is held in source region 4 on both the off-angle upstream side and the off-angle downstream side of trench 5.

Figure 6:
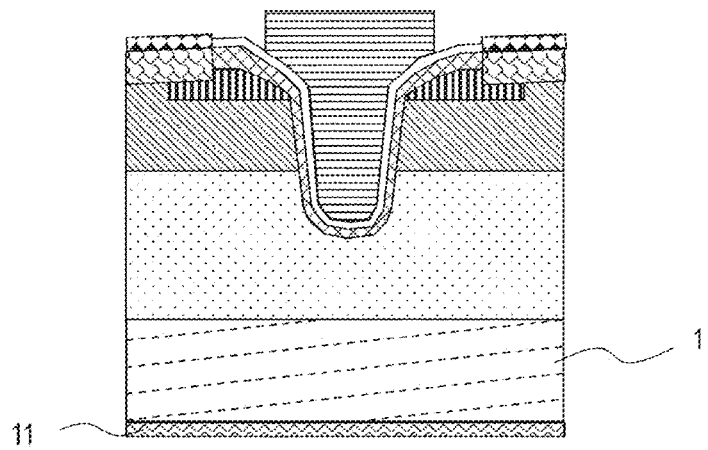
FIG. 6B is a schematic process sectional view for explaining the method for manufacturing a semiconductor device according to the first exemplary embodiment.

In the first exemplary embodiment, a difference in thickness of epitaxial layer 12 between the off-angle upstream side and the off-angle downstream side of trench 5 is kept small. Thus, it is easy to situate the bottom portion of alloy layer 10a in source region 4 on both the off-angle upstream side and the off-angle downstream side of trench 5. An unreacted part of metal layer 10b may be removed by etching in a step after silicidation. Subsequently, a conductive film composed of, for example, Ti or Ni is formed on a back surface opposite to the main surface of substrate 1 as shown in FIG. 6, and an annealing treatment is performed as necessary. Accordingly, drain electrode 11 is obtained. An order of formation of source electrode 10 and drain electrode 11 is not particularly limited.

In this way, semiconductor device 100 that is a trench-type MISFET can be obtained.

According to the manufacturing method according to the first exemplary embodiment, generation of {0001} facet plane F in a trench-adjacent region can be suppressed by adjusting conditions for growth of epitaxial layer 12. Accordingly, a variation in thickness of epitaxial layer 12 on the main surface of source region 4 can be reduced. Thus, the bottom portions of the alloy layers of source electrodes 10(L), 10(R) can be held in source region 4 on both the off-angle upstream side and the off-angle downstream side of trench 5. Therefore, a trench-type MISFET which has small on-resistance, and can be fed with a large current can be manufactured. A variation in thickness of epitaxial layer 12 on the side wall of trench 5 can be reduced, and therefore a variation in gate threshold voltage can be suppressed.

First Modification

Figure 7A:
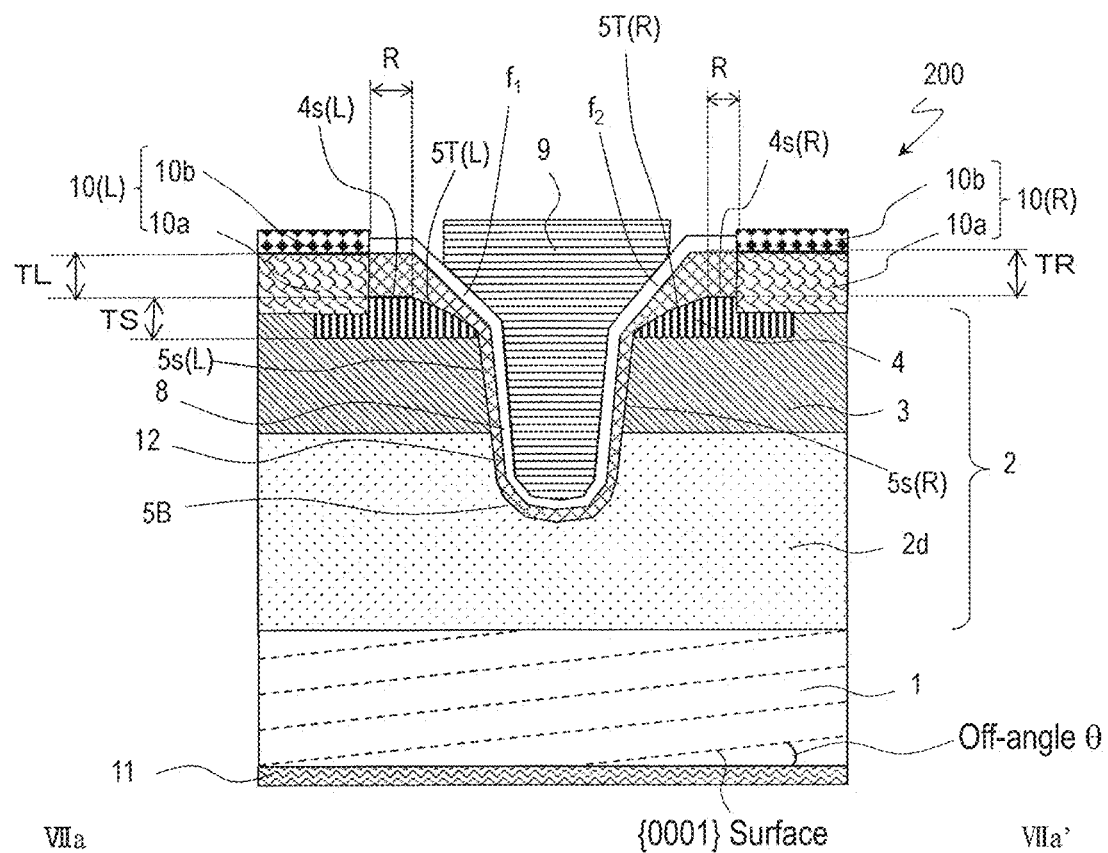
FIG. 7A is a sectional view taken along line VIIa-VIIa' shown in FIG. 7B.
Figure 7B:
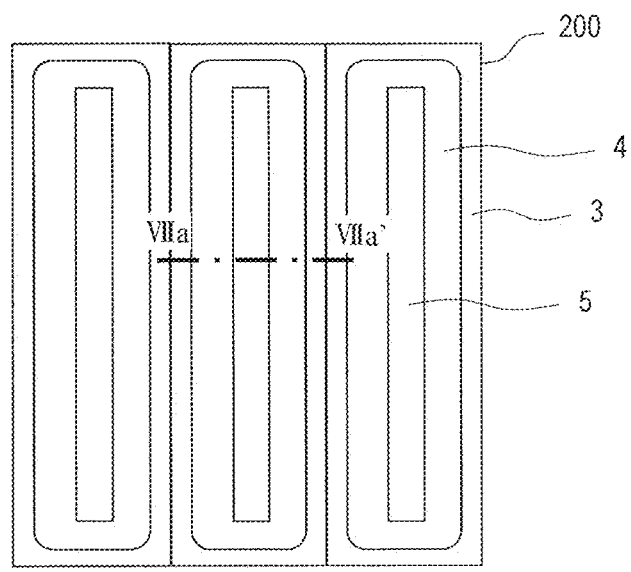
FIG. 7B is a plan view schematically showing the semiconductor device according to the modification of the first exemplary embodiment.

Hereinafter, with reference to FIGS. 7A and 7B, a semiconductor device according to a first modification of the first exemplary embodiment will be described. In FIGS. 7A and 7B, constituent elements similar to those of semiconductor device 100 are given like reference symbols, and descriptions of these constituent elements are omitted.

In semiconductor device 200 of this modification, epitaxial layer 12 has facet planes f1, f2 each having a crystal orientation different from that of each of main surface is of substrate 1 and a surface forming a side wall of a trench, on upper corner portion 5T of trench 5 as shown in FIG. 7A. Otherwise, semiconductor device 200 has a configuration similar to that of semiconductor device 100 shown in FIGS. 1A, 1B.

Upper corner portion 5T of trench 5 includes connection portion 5T(L) (hereinafter, referred to as a "first upper corner portion") situated between first side wall portion 5s(L) of trench 5 and first portion 4s(L) of source region 4, and connection portion 5T(R) (hereinafter, referred to as a "second upper corner portion") situated between second side wall portion 5s(R) of trench 5 and second portion 4s(R) of source region 4. Epitaxial layer 12 may include, on first upper corner portion 5T(L) and second upper corner portion 5T(R), facet planes f1, f2 each having a crystal orientation different from that of each of a {0001} surface and first and second side wall portions 5s(L) and 5s(R) of trench 5. As facet planes f1, f2, mention is made of, for example, a {0-33-8} surface. By forming facet planes f1, f2 on upper corner portions 5T(L), 5T(R) of trench 5, reliability of a gate oxide film can be improved on first upper corner portion 5T(l) and second upper corner portion 5T(R). Embedment of the gate electrode in trench 5 can also be properly performed.

Semiconductor device 200 can be manufactured by a method similar to the method for manufacturing semiconductor device 100 as described above with reference to FIGS. 2A to 6. Conditions for growth of epitaxial layer 12 are adjusted so that epitaxial layer 12 is formed at a low growth rate of, for example, 1.5 μm/hr or less. Accordingly, epitaxial layer 12 having facet planes f1, f2 can be formed on upper corner portions 5T(L), 5T(R) of trench 5. Specifically, by setting a supply amount of a raw material to be lower as compared to the growth conditions described above with reference to FIGS. 4A and 4B, the growth rate can be kept at 1.5 μm/hr or less. Here, for example, a flow rate of a monosilane gas is set to 5 sccm to 15 sccm inclusive, and a flow rate of a propane gas is set to 2 sccm to 6 sccm inclusive. A growth temperature and a growth pressure may be set to be lower. For example, the growth temperature is set to 1400° C. to 1500° C. inclusive, and the growth pressure is set to 5 hPa to 150 hPa inclusive. Accordingly, generation of a {0001} facet can be suppressed, and formation of facet planes f1, f2 can be promoted.

Regardless of presence or absence of an annealing step for forming the corner portion of trench 5 into a round shape, facet planes f1 and f2 having a crystal orientation different from that of each of the main surface of substrate 1 and a surface that forms the side wall of trench 5 can be formed at upper corner portions 5T(L) and 5(R) of trench 5 before formation of epitaxial layer 12. Thus, an annealing step before formation of epitaxial layer 12 may be omitted.

When epitaxial layer 12 having facet plane f1, f2 is formed, {0001} facet plane F is hardly generated on the main surface of SiC layer 2. Thereafter, absolute value (|TL−TR|) of a difference in thickness of epitaxial layer 12 on the main surface of the source region between the off-angle upstream side and the off-angle downstream side of trench 5 can be further reduced. Value |TL−TR| is, for example, equal to or less than ½ of thickness TS of source region 4. When value |TL−TR| is reduced, amounts of the raw material consumed during epitaxial growth on the main surface of SiC layer 2 become substantially equal on the off-angle upstream and on the off-angle downstream of trench 5. Accordingly, concentrations of the raw material arriving at first side wall portion 5s(L) and second side wall portion 5s(R) of trench 5 are substantially equal to each other, and therefore a variation in thickness of epitaxial layer 12 between these side wall portions can be reduced. Specifically, thickness C1 of epitaxial layer 12 on first side wall portion 5s(L) of trench 5 and thickness C2 of epitaxial layer 12 on second side wall portion 5s(R) of trench 5 satisfy a relationship of 0.9≤C1/C2≤1.1. Accordingly, a variation in gate threshold voltage between the off-angle upstream side and the off-angle downstream side of trench 5 can be further reduced.

Examples and Comparative Examples

As described above, the inventors of the present disclosure have found that when in growth of an epitaxial film in trench 5 formed on substrate 1 having an off-angle, the epitaxial film is grown at a low rate, generation of {0001} facet plane F in a trench-adjacent region can be suppressed. Hereinafter, a relationship between conditions for growth of the epitaxial film and generation of {0001} facet plane F will be described with reference to drawings.

Figure 8A:
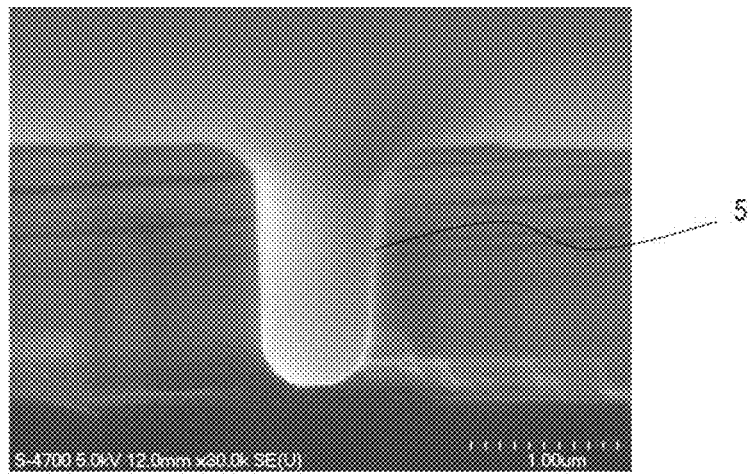
FIG. 8A is a view showing a scanning electron microscope (SEM) image of a cross-section showing a change in shape of a side wall of a trench, which is caused by an annealing treatment and epitaxial growth.
Figure 8B:
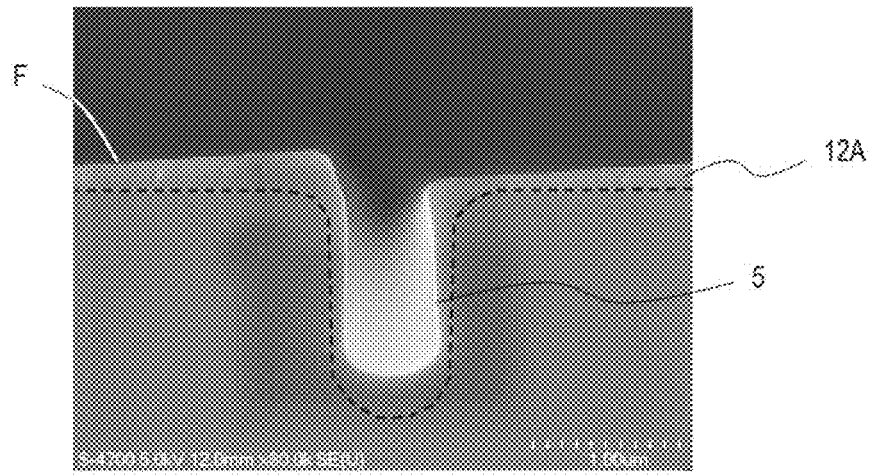
FIG. 8B is a view showing a scanning electron microscope (SEM) image of a cross-section showing a change in shape of a side wall of a trench, which is caused by an annealing treatment and epitaxial growth.
Figure 8C:
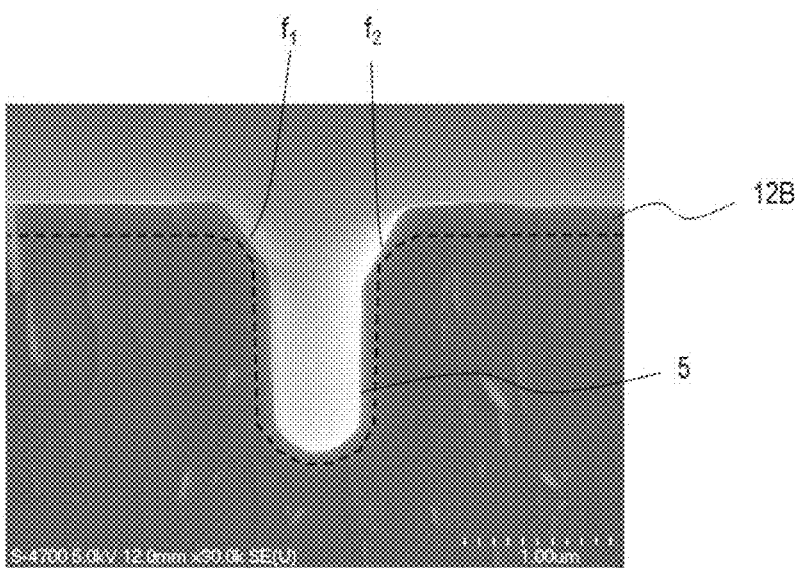
FIG. 8C is a view showing a scanning electron microscope (SEM) image of a cross-section showing a change in shape of a side wall of a trench, which is caused by an annealing treatment and epitaxial growth.

FIGS. 8A to 8C are views each showing a scanning electron microscope image of a cross-section of a SiC substrate having trench 5, where FIG. 8A shows a shape of the trench before formation of the epitaxial film, FIG. 8B shows a shape of the trench after formation of epitaxial film 12A (comparative example), and FIG. 8C shows a shape of the trench after formation of epitaxial film 12B (example).

Here, as a substrate, a 4H-SiC substrate was used in which an off-direction was a <11-20> direction, and a main surface was a {0001} Si (silicon) surface having an off-angle of 4°. Trench 5 was formed on the SiC substrate in such a manner that first and second side wall portions had a {11-20} surface. Thereafter, the SiC substrate was subjected to an annealing treatment at a temperature of 1550° C. and pressure of 200 hPa for 2 minutes in an argon (Ar) atmosphere. FIG. 8A is a SEM image of a cross-section of trench 5 in this state.

It is apparent from FIG. 8A that on the main surface of the substrate, a facet slightly exists on a right side of trench 5 due to generation of a step bunching, but there is almost no {0001} facet plane.

Subsequently, epitaxial film 12A was grown at a growth rate of 3.6 μm/hr in trench 5 shown in 8A (comparative example). As specific epitaxial growth conditions, a monosilane ($SiH_4$) gas flow rate was set to 30 sccm, a propane ($C_3H_8$) gas flow rate was set to 12 sccm, a temperature was set to 1550° C., and a pressure was set to 200 hPa.

FIG. 8B shows a SEM image of a cross-section of trench 5 in which epitaxial film 12A is formed. A broken line in FIG. 8B denotes a shape of a surface of trench 5 before growth of epitaxial film 12A.

It is apparent from FIG. 8B that {0001} facet plane F is generated on the main surface of the substrate which is adjacent to trench 5, and as a result, the trench has a left-right-asymmetric shape. It can be confirmed that a thickness of epitaxial film 12A on the main surface of the substrate considerably varies between an off-angle upstream side and an off-angle downstream side of trench 5. In this example, absolute value |TL−TR| of a difference in thickness is 0.2 μm. The thickness of epitaxial film 12A on a side wall of trench 5 also considerably varies between the off-angle upstream side and the off-angle downstream side of trench 5. In this example, ratio C1/C2 of the thickness is 1.25.

Subsequently, epitaxial film 12B was grown at a growth rate of 1.2 μm/hr in trench 5 shown in 8A (example). As specific epitaxial growth conditions, a monosilane (SiH$_4$) gas flow rate was set to 10 sccm, a propane (C$_3$H$_8$) gas flow rate was set to 4 sccm, a temperature was set to 1550° C., and a pressure was set to 200 hPa.

FIG. 8C shows a SEM image of a cross-section of trench 5 in which epitaxial film 12B is formed. A broken line in FIG. 8B denotes a shape of a surface of trench 5 before growth of epitaxial film 12B.

It is apparent from FIG. 8C that a {0001} facet plane is not generated on the main surface of the substrate which is adjacent to trench 5. It can be confirmed that a thickness of epitaxial film 12B on the main surface of the substrate is substantially uniform on the off-angle upstream side and on the off-angle downstream side of trench 5. The thickness of epitaxial film 12B on the side wall of trench 5 is also substantially uniform on the off-angle upstream side and on the off-angle downstream side of trench 5. Further, it can be confirmed that facet planes f1, f2 each having a crystal orientation different from that of each of a {0001} surface and a {11-20} are formed at an upper corner portion of trench 5.

It has been confirmed from the above results that when the growth rate of the epitaxial film is lower, generation of {0001} facet plane F on the main surface of the substrate which is adjacent to the trench can be more reliably suppressed. As a result of repeating experiments, it has been also confirmed that generation of {0001} facet plane F starts to be moderated at a growth rate of 3 μm/hr or less, and {0001} facet plane F is hardly generated at a growth rate of 1.5 μm/hr or less.

In each of the first exemplary embodiment and its modification, the semiconductor device has been described as an n-type MISFET in which a conductivity-type is an n-type, i.e. carriers are electrons, but the conductivity-type is not limited to an n-type, and the semiconductor device may be a p-type MISFET in which carriers are holes. In this case, a first conductive-type and a second conductive-type may be herein replaced by each other so that the first conductive-type is a p-type and the second conductive-type is an n-type.

The semiconductor devices according to the first exemplary embodiment and its modification have a MISFET structure in which a gate insulating film is provided between a SiC layer and a gate electrode, but the semiconductor device may have a MESFET structure in which the gate insulating film is not provided.

When a substrate and a semiconductor layer (drift region) formed on the substrate have mutually different conductivity-types, an insulated gate bipolar transistor (IGBT) can be formed in either of the first exemplary embodiment and the modification described above. In the IGBT, source electrode 10, drain electrode 11 and source region 4 in the above-mentioned trench-type MISFET are referred to as an emitter electrode, a collector electrode and an emitter region, respectively.

Therefore, when in the semiconductor device according to the first exemplary embodiment, etc., the conductivity-type of each of the drift region and the emitter region is an n-type, and the conductivity-type of each of the substrate and the body region is a p-type, an n-type IGBT can be obtained. Here, an n-type buffer layer may be disposed between the p-type substrate and the n-type drift region. Therefore, the conductivity-type of each of the drift region and the emitter region is a p-type, and the conductivity-type of each of the substrate and the body region is an n-type, a p-type IGBT can be obtained. Here, a p-type buffer layer may be disposed between the n-type substrate and the p-type drift region.

The first exemplary embodiment and its modification each show an example in which a plurality of unit cells are arranged side by side, but unit cells may be arranged in any form.

In the first exemplary embodiment and its modification, each trench has an oblong shape in terms of a planar shape, and the unit cells are arranged in such a manner that long sides of a plurality of trenches are in parallel to one another. However, the planar shape of the trench is not limited to an oblong shape. For example, the planar shape of the trench may be a square shape. In this case, a width direction of the trench may be along any one of the sides.

The first exemplary embodiment and its modification each show an example in which the substrate is composed of 4H-SiC, the main surface is a {0001} Si surface, and a SiC layer is formed on the main surface. However, a SiC layer and a drain electrode may be formed on a {000-1} C surface and the {0001} Si surface, respectively. The surface orientation of the main surface of the substrate may be changed to that of other crystal plane, or the substrate may have any off-cut surface of the Si surface or C surface as a main surface. Further, a SiC substrate of other polytype can be used.

By applying epitaxial growth conditions capable of suppressing a {0001} facet plane, a trench for alignment mark, which is formed by dry etching for lithography, can be prevented from losing its shape in a step of forming an epitaxial layer. Thus, a reduction in overlay accuracy in a lithography process can be prevented, and therefore a transistor having good processing accuracy can be prepared.

Semiconductor devices obtained including silicon carbide have been described above as an example, but the present disclosure may also be applied to a semiconductor device including a semiconductor other than silicon carbide (e.g., other wide band gap semiconductor such as gallium nitride (GaN) or aluminum nitride (AlN)).

Second Exemplary Embodiment

When the above-mentioned epitaxial growth conditions capable of suppressing a {0001} facet plane are applied not only to a device region in a trench-type MISFET, but also to an alignment mark for lithography, which is used in a process for manufacturing a trench-type device or a planar-type device, an additional effect is obtained.

Specifically, in an initial stage of the process for manufacturing a device, a level difference (e.g., trench or protrusion) is formed as an alignment mark for lithography process on a wafer surface. An epitaxial layer is also formed on the alignment mark in a step of forming an epitaxial layer in a channel region of the device, and consequently the alignment mark loses its shape, so that troubles of misalignment frequently occur. However, by applying epitaxial growth conditions in the present disclosure (a growth rate of 3.0 μm/hr or less, preferably 1.0 μm/hr or less), the alignment mark can be prevented from losing its shape. Thus, misalignment in the lithography process can be suppressed to secure alignment accuracy. Accordingly, a device integration degree can be improved, so that it is possible to improve device performance and a yield.

Figure 14A:
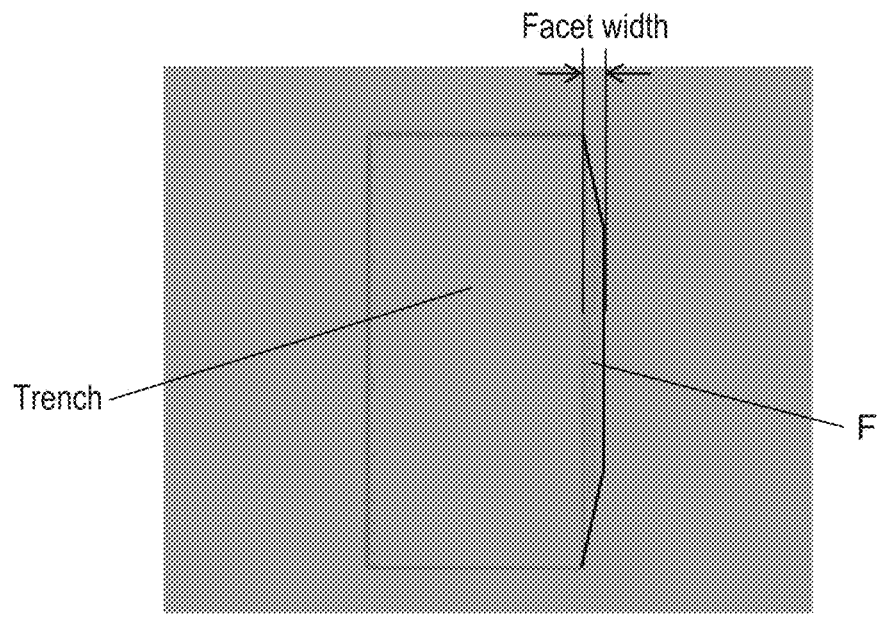
FIG. 14A is a view for explaining a state of a trench state after epitaxial growth in the trench.

FIG. 14A is a view showing a metal microscope image of a wafer surface in growth under conventional epitaxial growth conditions in a trench formed on the wafer surface. It is apparent from FIG. 14A that large facet F is generated near a right side of the trench, and a trench loses its shape and becomes left-right-asymmetric. Similarly, facet F is also generated in the trench for alignment, and therefore alignment accuracy in lithography using an exposure apparatus such as a stepper is deteriorated.

Figure 14B:
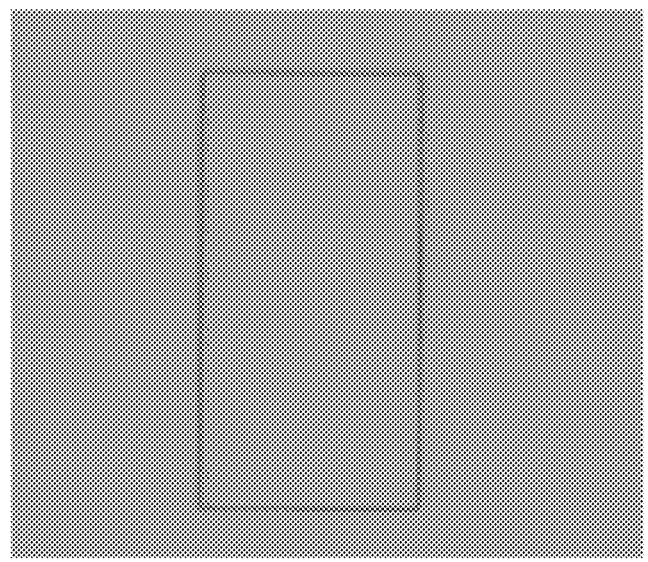
FIG. 14B is a view for explaining a state of a trench state after epitaxial growth in the trench.

On the other hand, FIG. 14B is a view showing a metal microscope image of a wafer surface in growth under epitaxial growth conditions in the present disclosure (a growth rate is 3.0 μm/hr or less, preferably 1.0 μm/hr or less) in the trench formed on the wafer surface. It is apparent from FIG. 14B that there is almost no facet near the trench, and the trench does not lose its shape. Accordingly, alignment accuracy in lithography can be secured.

<Structure of Semiconductor Device>

Hereinafter, with reference to FIGS. 15A, 15B, 15C and 15D, a semiconductor device according to a second exemplary embodiment will be described with a silicon carbide semiconductor device shown as an example. A device structure is described by showing as an example a planar-type MISFET having a trench for alignment.

Semiconductor device 300 is a metal-insulator-semiconductor field effect transistor (MISFET) which is formed using a SiC semiconductor and which has a planar gate structure. Semiconductor device 300 typically includes a plurality of unit cells.

Figure 15A:
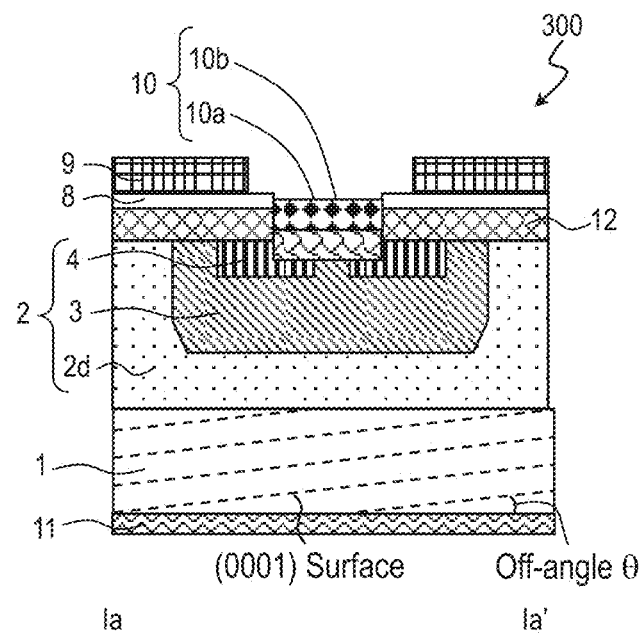
FIG. 15A is a sectional view taken along line Ia-Ia' shown in FIG. 15C.

FIG. 15A is a schematic sectional view illustrating one unit cell in semiconductor device 300. FIG. 15C is a schematic plan view showing one example of a configuration in which a plurality of unit cells are disposed in semiconductor device 300. FIG. 15A shows a cross-section taken along line Ia-Ia' in FIG. 15C.

Figure 15B:
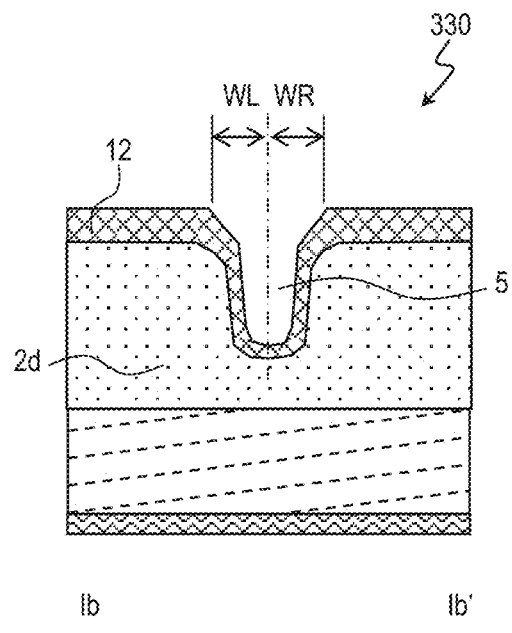
FIG. 15B is a sectional view taken along line Ib-Ib' shown in FIG. 15D.
Figure 15C:
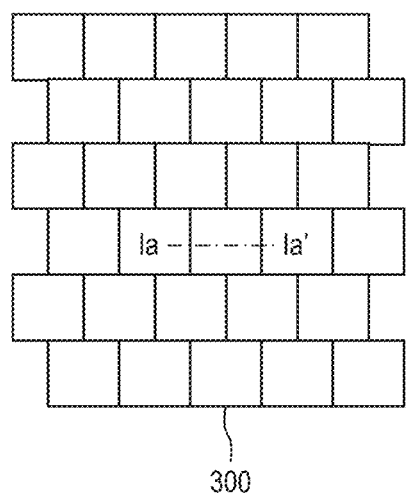
FIG. 15C is a plan view showing the semiconductor device according to the second exemplary embodiment, and an alignment mark.
Figure 15D:
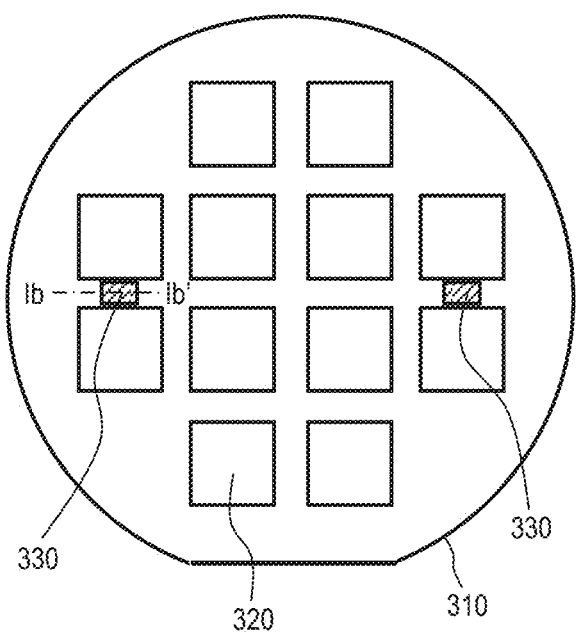
FIG. 15D is a plan view showing the semiconductor device according to the second exemplary embodiment, and an alignment mark.

FIG. 15B is a sectional view of a level difference (e.g., trench here) to be used as an alignment mark for lithography process, which is formed on a wafer surface. FIG. 15D is a schematic plan view showing one example of a configuration of device region 320 which is disposed on a surface of SiC wafer 310 and which includes at least semiconductor device 300, and alignment mark region 330 for lithography, which is disposed between device regions 320. FIG. 15B shows a cross-section taken along line Ib-Ib' in FIG. 15D.

Here, a planar shape of a unit cell is a square shape, but the planar shape of the unit cell is not limited to a square shape, but may be an oblong shape. The planar shape of the unit cell may be other polygonal shape, a circular shape or the like. The number of unit cells is not particularly limited.

A plurality of alignment marks for lithography may be formed, and a surface shape of the alignment mark may be square or oblong, or polygonal or circular. A cross-section of the alignment mark may have a shape like a trench (groove) or a protrusion.

Semiconductor device 300 and alignment mark region 330 include substrate 1 having main surface is inclined in an off-direction from a {0001} surface, and semiconductor layer 2 disposed on main surface is of substrate 1. In the second exemplary embodiment, for example, substrate 1 is a silicon carbide substrate, and semiconductor layer 2 is a silicon carbide (SiC) layer. Alignment mark region 330 may be provided with trench 5.

As substrate 1, a substrate composed of first conductive-type (n-type) SiC (also referred to simply as a SiC substrate) can be used. A broken line shown in substrate 1 denotes a {0001} just surface. The main surface and the {0001} just surface of the substrate form angle θ (off-angle). Main surface is of substrate 1 is, for example, a {0001} Si (silicon) surface having off-angle θ. Substrate 1 may be a substrate having as a main surface a surface having a {0001} surface and off-angle θ, or a SiC substrate having a C (carbon) surface as a main surface. Substrate 1 may be a substrate having any polytype structure. Here, as one example, a 4H-SiC substrate may be used in which the off-direction is a <11-20> direction and the off-angle is 4° with respect to, for example, the {0001} surface. The off-direction is not limited to the above, and may be a <1-100> direction, and the off-angle may be 8° or 2°, or other angle.

SiC layer 2 is an epitaxial growth layer formed on the main surface of substrate 1 by epitaxial growth. SiC layer 2 is not limited to an epitaxial layer.

SiC layer 2 has first conductive-type drift region 2d, second conductive-type body region 3 and first conductive-type source region 4. An impurity concentration of drift region 2d is set to be lower than an impurity concentration of substrate 1. Body region 3 is disposed on drift region 2d. Body region 3 may be formed so as to be in contact with an upper surface of SiC layer 2. Source region 4 is situated on body region 3, and is in contact with the upper surface of SiC layer 2. Source region 4 may be disposed in body region 3 (e.g., a part of a surface region). Here, the first conductive-type and the second conductive-type are an n-type and a p-type, respectively. Here, the first conductive-type and the second conductive-type may be a p-type and an n-type, respectively.

In the example shown in FIG. 15A, a lower surface and a side surface of source region 4 are surrounded by body region 3. Body region 3 can be formed by, for example, implanting p-type impurity ions into SiC layer 2, and source region 4 can be formed by, for example, implanting n-type impurity ions into SiC layer 2.

In the example shown in FIG. 15B, trench 5 formed as an alignment mark has a bottom portion and a side wall which are situated in drift region 2d. As long as depth of trench 5 can be recognized by an exposure apparatus such as a stepper, the depth of the trench is not particularly limited, and may reach substrate 1. An angle of a trench side wall is preferably as close as possible to a right angle, and more preferably 80° to 90°. The trench has a forward tapered shape, but may be a reverse tapered shape.

As shown in FIG. 15A, epitaxial layer 12 is disposed so as to cover a part of main surfaces of drift region 2d, body region 3 and source region 4 in semiconductor device 300. Epitaxial layer 12 is, for example, a first conductive-type (n-type) SiC epitaxial layer. As shown in FIG. 15B, epitaxial layer 12 is disposed so as to cover a top of the main surface of drift region 2d and an inside of trench 5 in alignment mark region 330. Left-right-asymmetry of the alignment mark region, which is caused by epitaxial layer 12, is suppressed, so that the alignment mark region is left-right-symmetric. Where WL is a distance between a center line (dot-and-dash line) of trench 5 and a boundary between an off-angle upstream side corner portion of the trench and the main surface or a {0001} facet plane generated on the main surface, and WR is a distance between the center line (dot-and-dash line) of trench 5 and a boundary between an off-angle downstream side corner portion of the trench and the main surface or a {0001} facet plane generated on the main surface, value |WL−WR| is preferably 1 μm or less, more preferably 0.5 μm or less, still more preferably 0.2 μm or less.

Gate insulating film 8 is formed on a surface of epitaxial layer 12 formed on a part of main surfaces of drift region 2d, body region 3 and source region 4 in semiconductor device 300. In a MISFET, a region near an interface (MIS interface) between epitaxial layer 12 and gate insulating film 8, on the main surface of body region 3, is a "channel region". Gate insulating film 8 may be, for example, a so called thermal oxide film formed by thermal oxidation, such as silicon oxide film or a silicon oxide film containing nitrogen (N), or may be a deposition insulating film.

Gate electrode 9 is provided on gate insulating film 8. Gate electrode 9 may be formed so as to cover at least a portion of gate insulating film 8, which is situated on body region 3. gate electrode 9 and SiC layer 2 are insulated by gate insulating film 8.

On SiC layer 2, source electrode 10 that applies a common potential to body region 3 and source region 4 is disposed so as to be in contact with both body region 3 and source region 4. Source electrode 10 includes alloy layer 10a that is in contact with SiC layer 2.

Drain electrode 11 is disposed on a surface (back surface) of substrate 1 which is opposite to SiC layer 2.

Semiconductor device 300 includes a channel layer (epitaxial layer 12), and is therefore called a accumulation-mode MISFET. Operations of the accumulation-mode MISFET are partially different from operations of a MISFET (inversion-mode MISFET) which does not include a channel layer. For example, in an off-state in which a bias voltage lower than a threshold voltage is applied to gate electrode 9, the semiconductor device is in a depletion state in which the channel layer is depleted by a p-n junction of the channel layer and body region 3, so that a current does not pass (off-state). In an on-state in which a bias voltage equal to or higher than a threshold voltage is applied to gate electrode 9, the semiconductor device is in a accumulation state in which electrons are stored in a high concentration in first conductive-type channel layer 12, so that a current passes (on-state).

In semiconductor device 300 according to the second exemplary embodiment, left-right-asymmetry of the alignment mark region, which is caused by the epitaxial layer, is suppressed as described above, and therefore misalignment in the lithography process can be suppressed, so that it is easy to secure alignment accuracy.

A method for manufacturing a semiconductor device according to the second exemplary embodiment will be described more in detail with reference to drawings.

<Method for Manufacturing Semiconductor Device According to Second Exemplary Embodiment>

Hereinafter, one example of a method for manufacturing semiconductor device 300 according to the second exemplary embodiment will be described with reference to drawings.

FIGS. 16A to 19D are process sectional views for explaining one example of the method for manufacturing semiconductor device 300. In FIGS. 16A to 19D, FIG. 16A is a schematic sectional view illustrating one unit cell (MIS transistor here) in semiconductor device 300. FIG. 16B is a schematic sectional view illustrating an alignment mark for lithography process, which is formed on a wafer surface.

Figure 16A:
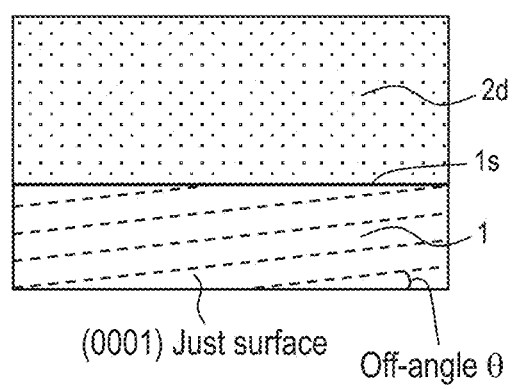
FIG. 16A is a schematic process sectional view for explaining a method for manufacturing a semiconductor device according to the second exemplary embodiment.
Figure 16B:
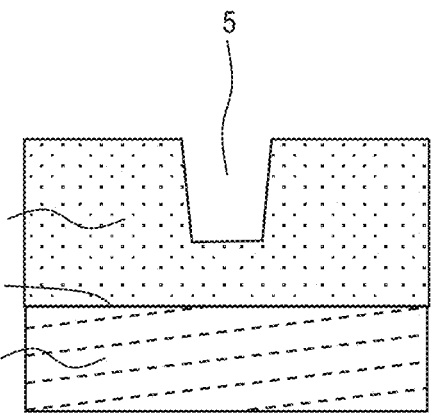
FIG. 16B is a schematic process sectional view for explaining the method for manufacturing a semiconductor device according to the second exemplary embodiment.

First, on main surface is of substrate 1 having off-angle θ, drift region 2d is formed, and trench 5 for the alignment mark for lithography process is formed as shown in FIGS. 16A and 16B.

As substrate 1, for example, a first conductive-type (n-type) 4H-SiC substrate having off angle θ of 4° with respect to a {0001} surface is used. An off-direction is, for example, a <11-20> direction.

SiC layer 2 is formed in a manner as described below. First, n-type SiC layer 2 is formed on main surface is of substrate 1 by, for example, a chemical vapor deposition (CVD) method which is capable of performing epitaxial growth. SiC layer 2 has a carrier concentration of, for example, $8\times10^{15}$ cm$^{-3}$ and a thickness of, for example, 12 µm. As an n-type dopant, for example, nitrogen (N) ions can be used.

Here, SiC layer 2 is formed by epitaxial growth. Conditions for epitaxial growth are not particularly limited, but generally, conditions are set so as to achieve a growth rate of 5 µm to 10 µm inclusive. For example, a silicon-based gas such as, for example, a monosilane (SiH$_4$) gas, and a carbon-based gas such as, for example, a propane (C$_3$H$_8$) gas are each supplied in an amount of 30 sccm to 60 sccm inclusive, and a C/Si ratio (ratio of a number of C atoms to a number of Si atoms in a supplied gas) is set to, for example, 1.0 to 1.8 inclusive. A growth pressure is set to 100 hPa to 300 hPa inclusive. A substrate temperature is set to, for example, 1500° C. to 1650° C. inclusive.

For trench 5 for the alignment mark, reactive ion etching (RIE) is performed by a lithography method and an etching method using a mask film (not illustrated) having an opening pattern for formation of an alignment mark, such as, for example, a photoresist or a SiO2 film. Accordingly, trench 5 having a depth of, for example, 1.0 µm is formed on drift region 2d. The depth may be larger or smaller than 1.0 µm, and is preferably about 0.4 µm to 2.0 µm taking into consideration a contrast in detection using an exposure apparatus, and an etching treatment time. A surface shape of the alignment mark may be appropriately adjusted in conformity to specifications of an exposure apparatus (e.g., stepper).

Figure 16C:
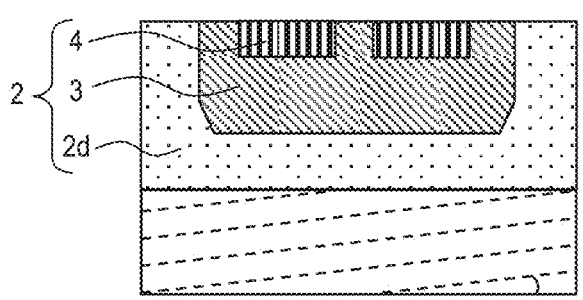
FIG. 16C is a schematic process sectional view for explaining the method for manufacturing a semiconductor device according to the second exemplary embodiment.
Figure 16D:
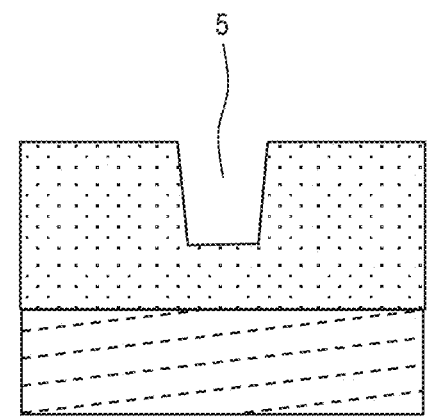
FIG. 16D is a schematic process sectional view for explaining the method for manufacturing a semiconductor device according to the second exemplary embodiment.

Next, SiC layer 2 including body region 3 and source region 4 is formed in drift region 2d on main surface is of substrate 1 having off-angle θ by implanting ions as shown in FIGS. 16C and 16D. Here, ions may be optionally implanted into the alignment mark and a periphery of the alignment mark.

Body region 3 has a carrier concentration of, for example, $1\times10^{18}$ cm$^{-3}$ and a thickness of, for example, 1.2 µm. Body region 3 is obtained by, for example, ion-implanting a p-type dopant into n-type SiC layer 2 obtained by the above-mentioned method. As the p-type dopant, for example, aluminum (Al) ions etc. may be used. A region of SiC layer 2, which excludes a portion provided with body region 3, is drift region 2d. Body region 3 may be formed by epitaxially growing silicon carbide while supplying trimethylaluminum (TMA) etc. as a p-type dopant onto n-type SiC layer 2.

Subsequently, n-type source region 4 is selectively formed on a top of body region 3. Source region 4 has a carrier concentration of, for example, $5\times10^{19}$ cm$^{-3}$ and a thickness of, for example, 0.2 µm. Source region 4 is obtained by implanting N ions etc. as a n-type dopant into body region 3 using, for example, a mask film (not illustrated) formed on SiC layer 2 and composed of silicon oxide, polysilicone or the like.

After the ions are implanted, an annealing treatment is performed at a temperature of 1700° C. for 30 minutes in, for example, an inert gas atmosphere. The annealing treatment activates impurity ions implanted into body region 3 and source region 4. Body region 3 may include a contact region containing a p-type impurity in a high concentration.

Figure 17A:
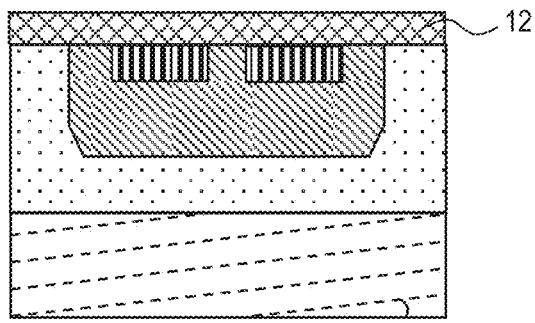
FIG. 17A is a schematic process sectional view for explaining the method for manufacturing a semiconductor device according to the second exemplary embodiment.
Figure 17B:
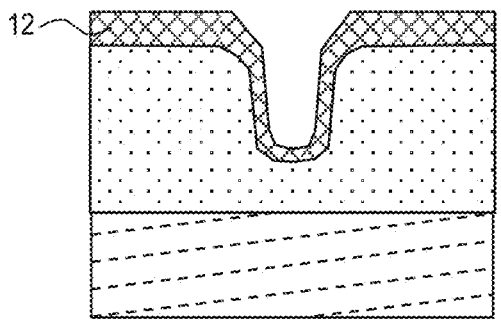
FIG. 17B is a schematic process sectional view for explaining the method for manufacturing a semiconductor device according to the second exemplary embodiment.

Next, epitaxial layer 12 is formed on a main surface of SiC layer 2 and a surface of the alignment mark as shown in FIGS. 17A and 17B.

In the second exemplary embodiment, generation of a {0001} facet on the off-angle downstream side of trench 5 for the alignment mark can be suppressed by optimally adjusting epitaxial growth conditions for forming epitaxial layer 12. Thus, the alignment mark can be inhibited from losing its shape and becoming left-right-asymmetric.

Here, an epitaxial film is grown on the main surface of SiC layer 2 at a low growth rate of 3 μm/hr or less, more preferably 1.5 μm/hr or less using a chemical vapor deposition (CVD) apparatus. The growth rate is an average of growth rates on the main surface of SiC layer 2. Specifically, a silicon-based gas such as, for example, a monosilane ($SiH_4$) gas, and a carbon-based gas such as, for example, a propane ($C_3H_8$) gas are used. For example, the monosilane gas is supplied onto SiC layer 2 at a flow rate of 5 sccm or more and less than 30 sccm, and the propane gas is supplied onto SiC layer 2 at a flow rate of 2 sccm or more and less than 12 sccm to perform epitaxial growth. A growth temperature is set to, for example, 1400° C. to 1550° C. inclusive, and a growth pressure is set to, for example, 10 to 250 hPa. A C/Si ratio (ratio of a number of C atoms to a number of Si atoms in the raw material gas supplied) may be set to, for example, 0.8 to 1.2. A H/Si ratio (ratio of a number of H atoms to a number of Si atoms in the raw material gas supplied) may be set to 1000 to 100000.

When supply flow rates of raw materials such as a monosilane gas and a propane gas are set to be lower than supply flow rates in formation of SiC layer 2, the growth rate can be reduced. Here, by setting supply flow rates of the monosilane gas and the propane gas within a range as described above, the growth rate can be reduced to, for example, 3 μm/hr or less.

One of factors of promoting generation of a {0001} facet plane may be generation of a step bunching. The step bunching is easily generated when a raw material is excessively supplied to a substrate surface. When the raw material excessively exists, SiC is formed before the raw material arrives at a step, and therefore two-dimensional nucleus growth is apt to occur rather than a step flow. Accordingly, by decreasing a supply amount of the raw material to reduce the growth rate to, for example, 3 μm/hr or less, the {0001} facet can be reduced.

The step bunching is easily generated when the growth temperature is high. For suppressing generation of the step bunching, it is preferable to set the growth temperature to, for example, 1550° C. or lower. When the growth temperature is excessively low, polycrystalline SiC may be generated, leading to an increase in amount of particles. Therefore, it is preferable to set the growth temperature to, for example, 1400° C. or higher.

For further suppressing generation of the step bunching, it is also effective to promote surface diffusion. When the growth pressure is set to be low (e.g., 10 hPa to 250 hPa inclusive), surface diffusion can be promoted to suppress the step bunching, leading to reduction of the {0001} facet.

Figure 17C:
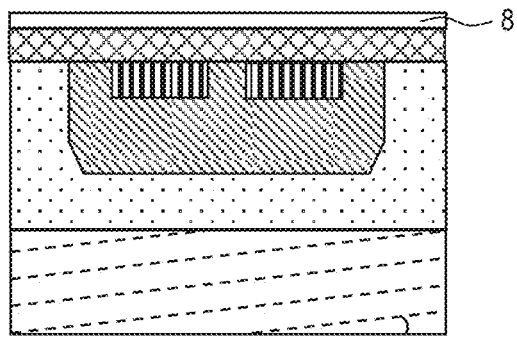
FIG. 17C is a schematic process sectional view for explaining the method for manufacturing a semiconductor device according to the second exemplary embodiment.
Figure 17D:
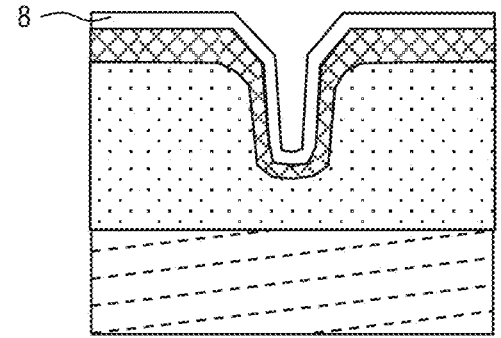
FIG. 17D is a schematic process sectional view for explaining the method for manufacturing a semiconductor device according to the second exemplary embodiment.

Next, gate insulating film 8 is formed on a surface of epitaxial layer 12 as shown in FIGS. 17C and 17D.

For example, gate insulating film 8 is formed in a manner as described below. First, substrate 1 is washed. Thereafter, for example, substrate 1 is placed in a thermal oxidation furnace, and subjected to a thermal oxidation treatment at 1200° C. for 0.5 hours in a dry oxidizing atmosphere. Accordingly, as gate insulating film 8, a silicon oxide film being a thermal oxide film is formed so as to extend from the upper surface of body region 3 and the upper surface of source region 4 onto the side wall and bottom surface of trench 5. Gate insulating film 8 may be a deposition insulating film formed by a chemical vapor deposition (CVD) method, a sputtering method or the like.

Here, the oxide film is also formed in the trench for the alignment mark and on a periphery of the trench, and may be removed.

Figure 18A:
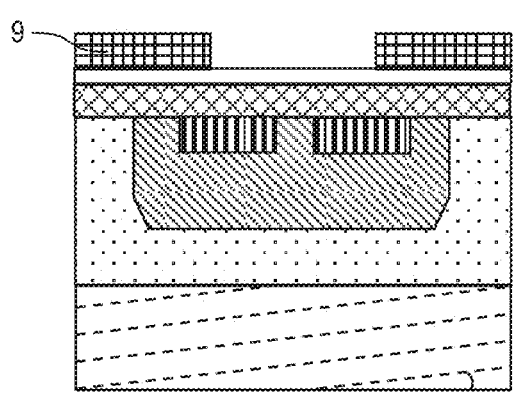
FIG. 18A is a schematic process sectional view for explaining the method for manufacturing a semiconductor device according to the second exemplary embodiment.
Figure 18B:
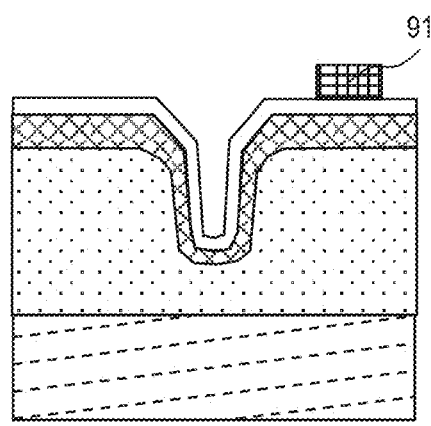
FIG. 18B is a schematic process sectional view for explaining the method for manufacturing a semiconductor device according to the second exemplary embodiment.

Next, gate electrode 9 is formed on gate insulating film 8 as shown in FIGS. 18A and 18B.

For example, gate electrode 9 is formed in a manner as described below. First, using a low-pressure CVD (LP-CVD) method, a polysilicon film doped with phosphorus (P) is deposited in a thickness of, for example, 1000 nm on a whole surface of a wafer which is provided with gate insulating film 8. Subsequently, a rapid thermal annealing (RTA) treatment is performed at a temperature of 1000° C. for 60 seconds in, for example, an inert gas atmosphere to activate doped phosphorus. Thereafter, for example a resist film (not illustrated) for masking a gate electrode-formed region is formed on the polysilicon film using a lithography method and an etching method.

Subsequently, gate electrode 9 is formed by etching the polysilicon film with the resist film as a mask using a RIE method. Gate electrode 9 may be formed on at least a region facing body region 3.

In the lithography process, the alignment mark does not lose its shape, and therefore misalignment in the lithography process can be reduced, so that gate electrode 9 can be accurately formed. Thus, in device design, an alignment margin can be reduced, so that a yield of the device can be secured, and a device integration degree can be increased, so that device performance can be improved.

The polysilicon film is also formed in the alignment mark region, and may be etched and removed (the polysilicon film is removed in the figure). Alternatively, another alignment mark 91 may be formed using a polysilicon film as shown in FIG. 18B.

Figure 18C:
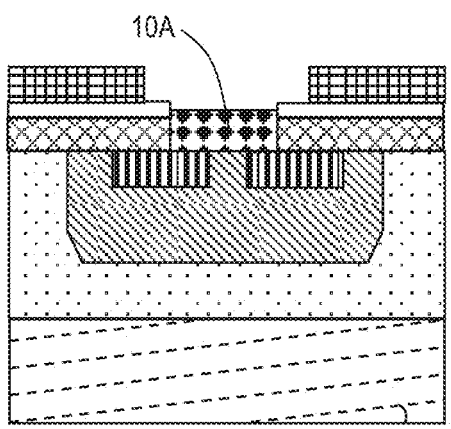
FIG. 18C is a schematic process sectional view for explaining the method for manufacturing a semiconductor device according to the second exemplary embodiment.
Figure 18D:
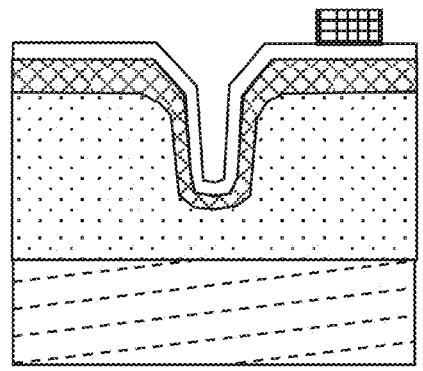
FIG. 18D is a schematic process sectional view for explaining the method for manufacturing a semiconductor device according to the second exemplary embodiment.

Next, conductive film 10A is formed in such a manner that conductive film 10A is kept at a distance from gate electrode 9, and is in contact with source region 4 as shown in FIGS. 18C and 18D. Conductive film 10A may be formed so as to be in contact with body region 3. Conductive film 10A is also formed in the alignment mark region, and may be etched and removed (conductive film 10A is removed in the figure).

Specifically, first an interlayer insulating film (not illustrated) is formed so as to cover SiC layer 2 and gate electrode 9 using a CVD method or the like. Subsequently, using a lithography method and an etching method, the interlayer insulating film is provided with an opening that exposes a surface of SiC layer which includes source region 4. Thereafter, using a sputtering method or the like, for example a conductive film 10A is formed in the opening provided in the interlayer insulating film. Conductive film 10A may be a metal film containing a metal (first metal) such as Ti or Ni.

Figure 19A:
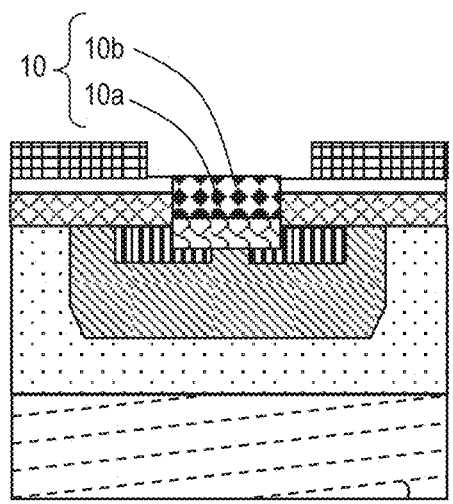
FIG. 19A is a schematic process sectional view for explaining the method for manufacturing a semiconductor device according to the second exemplary embodiment.
Figure 19B:
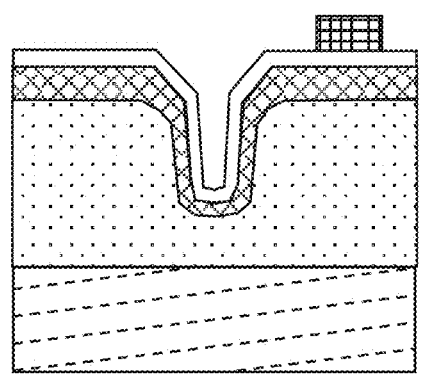
FIG. 19B is a schematic process sectional view for explaining the method for manufacturing a semiconductor device according to the second exemplary embodiment.

Next, the metal contained in conductive film 10A is silicidated to form source electrode 10 including alloy layer 10a as shown in FIGS. 19A and 19B.

As a method for silicidation, for example, an annealing treatment is performed in an inert gas atmosphere and at a temperature of 950° C. for about 1 minute. Accordingly, the first metal in conductive film 10A reacts with silicon carbide in epitaxial layer 12 and source region 4 to form alloy layer 10a. A portion of conductive film 10A which has not reacted with silicon carbide may remain as metal layer 10b. Here, when alloy layer 10a does not extend to source region 4, or alloy layer 10a extends to below the lower surface of source region 4, an amount of a contact resistance component of source region 4 and source electrode 10 increases. Thus, a temperature and a treatment time for the annealing treatment are appropriately adjusted so that the bottom portion of alloy layer 10a is held in source region 4.

An unreacted part of metal layer 10b may be removed by etching in a step after silicidation.

Figure 19C:
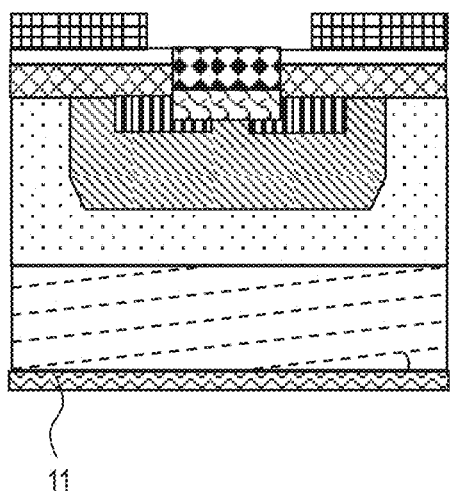
FIG. 19C is a schematic process sectional view for explaining the method for manufacturing a semiconductor device according to the second exemplary embodiment.
Figure 19D:
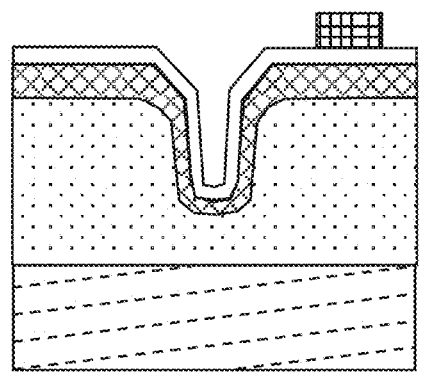
FIG. 19D is a schematic process sectional view for explaining the method for manufacturing a semiconductor device according to the second exemplary embodiment.

Subsequently, a conductive film composed of, for example, Ti or Ni is formed on a back surface opposite to the main surface of substrate 1 as shown in FIGS. 19C and 19D, and an annealing treatment is performed as necessary. Accordingly, drain electrode 11 is obtained. An order of formation of source electrode 10 and drain electrode 11 is not particularly limited. As in FIG. 15B, gate insulating film 8 and alignment mark 91 formed in the alignment mark region may be removed in completion of the device.

In this way, semiconductor device 300 that is a planar-type MISFET can be obtained.

According to the manufacturing method according to the second exemplary embodiment, by adjusting conditions for growth of epitaxial layer 12, generation of {0001} facet plane F in a region adjacent to the trench for the alignment mark can be suppressed to inhibit the alignment mark from losing its shape. Accordingly, misalignment in the lithography process can be suppressed to secure alignment accuracy. Accordingly, a device integration degree can be improved, so that it is possible to improve device performance and a yield.

Shapes, sizes, impurity concentrations and various constituent elements such as constituent materials for constituent members in these exemplary embodiments and their modifications can be appropriately changed without departing from the spirit of the present disclosure.

The semiconductor device according to the present disclosure, and the method for manufacturing the semiconductor device are useful in applications of, for example, semiconductor devices having a trench gate-type structure, more specifically power semiconductor devices to be mounted on vehicles such as electric vehicles (EVs) or hybrid electric vehicles (HEVs), or inverters for industrial equipment.

What is claimed is:

1. A semiconductor device comprising:
    a substrate having a main surface inclined in an off-direction from a {0001} surface; and
    a semiconductor layer disposed on the main surface of the substrate,
    wherein:
    the semiconductor layer has a level difference for alignment mark,
    an epitaxial layer is provided in the level difference for alignment mark and on a main surface of the semiconductor layer in a region adjacent to the level difference for alignment mark, and
    where an upstream side is an off-angle upstream side and a downstream side is an off-angle downstream side in a direction with the off-direction projected on the main surface of the substrate, the epitaxial layer is disposed on a first portion of the main surface of the semiconductor layer, the first portion being situated on the off-angle upstream side of the level difference for alignment mark and on a second portion of the main surface of the semiconductor layer, the second portion being situated on the off-angle downstream side of the level difference for alignment mark, in the region adjacent to the level difference for alignment mark, and a value of |WL−WR| is 1 μm or less, in which WL represents a distance from a center of the level difference for alignment mark to a boundary between an off-angle upstream side corner portion of the level difference for alignment mark and a main surface or a {0001} facet plane generated on the main surface, and WR represents a distance from the center of the level difference for alignment mark to a boundary between an off-angle downstream side corner portion of the level difference for alignment mark and the main surface or the {0001} facet plane generated on the main surface.

2. The semiconductor device according to claim 1, wherein the value of |WL−WR| is 0.5 μm or less, in which WL represents the distance from the center of the level difference for alignment mark to the boundary between the off-angle upstream side corner portion of the level difference for alignment mark and the main surface or the {0001} facet plane generated on the main surface, and WR represents the distance from the center of the level difference for alignment mark to the boundary between the off-angle downstream side corner portion of the level difference for alignment mark and the main surface or the {0001} facet plane generated on the main surface.

3. The semiconductor device according to claim 1, wherein the value of |WL−WR| is 0.2 μm or less, in which WL represents the distance from the center of the level difference for alignment mark to the boundary between the off-angle upstream side corner portion of the level difference for alignment mark and the main surface or the {0001} facet plane generated on the main surface, and WR represents the distance from the center of the level difference for alignment mark to the boundary between the off-angle downstream side corner portion of the level difference for alignment mark and the main surface or the {0001} facet plane generated on the main surface.

4. The semiconductor device according to claim 1, wherein the epitaxial layer includes, on the off-angle upstream side corner portion and the off-angle downstream side corner portion of the level difference for alignment mark, a facet plane having a crystal orientation different from each of a crystal orientation of the {0001} surface and a crystal orientation of a surface forming a side wall portion of the level difference for alignment mark.

5. The semiconductor device according to claim 2, wherein the epitaxial layer includes, on the off-angle upstream side corner portion and the off-angle downstream side corner portion of the level difference for alignment mark, a facet plane having a crystal orientation different from each of a crystal orientation of the {0001} surface and a crystal orientation of a surface forming a side wall portion of the level difference for alignment mark.

6. The semiconductor device according to claim 3, wherein the epitaxial layer includes, on the off-angle upstream side corner portion and the off-angle downstream side corner portion of the level difference for alignment mark, a facet plane having a crystal orientation different from each of a crystal orientation of the {0001} surface and a crystal orientation of a surface forming a side wall portion of the level difference for alignment mark.

* * * * *